(12) United States Patent
Sugawa et al.

(10) Patent No.: US 7,821,560 B2
(45) Date of Patent: Oct. 26, 2010

(54) OPTICAL SENSOR, SOLID-STATE IMAGING DEVICE, AND OPERATING METHOD OF SOLID-STATE IMAGING DEVICE

(75) Inventors: Shigetoshi Sugawa, Miyagi (JP); Nana Akahane, Miyagi (JP)

(73) Assignee: Tohoku Universityu, Miyagi (JP)

( * ) Notice: Subject to any disclaimer, the term of this patent is extended or adjusted under 35 U.S.C. 154(b) by 405 days.

(21) Appl. No.: 11/887,916

(22) PCT Filed: Apr. 6, 2006

(86) PCT No.: PCT/JP2006/307349
§ 371 (c)(1),
(2), (4) Date: Oct. 5, 2007

(87) PCT Pub. No.: WO2006/109683
PCT Pub. Date: Oct. 19, 2006

(65) Prior Publication Data
US 2009/0045319 A1 Feb. 19, 2009

(30) Foreign Application Priority Data
Apr. 7, 2005 (JP) ............................ 2005-111071

(51) Int. Cl.
H04N 5/335 (2006.01)
H04N 3/14 (2006.01)
(52) U.S. Cl. .................................. 348/308; 250/208.1
(58) Field of Classification Search ......... 348/294–310; 250/208.1
See application file for complete search history.

(56) References Cited

U.S. PATENT DOCUMENTS

| | | | |
|---|---|---|---|
| 6,246,436 B1 | 6/2001 | Lin et al. | |
| 6,780,666 B1 * | 8/2004 | McClure | 438/57 |
| 6,888,122 B2 * | 5/2005 | Fossum | 250/208.1 |
| 6,974,975 B2 | 12/2005 | Shizukuishi | |
| 2002/0000508 A1 | 1/2002 | Muramatsu et al. | |
| 2004/0239791 A1 | 12/2004 | Mabuchi | |

FOREIGN PATENT DOCUMENTS

| | | |
|---|---|---|
| JP | 3-270579 | 12/1991 |
| JP | 5-090556 | 4/1993 |

(Continued)

OTHER PUBLICATIONS

S. Inoue et al., "A 3.25M-pixel APS-C size CMOS Image Sensor," IEEE Workshop on CCDs and Advanced Image Sensor, 2001, pp. 16-19.

(Continued)

Primary Examiner—Sinh Tran
Assistant Examiner—Anthony J Daniels
(74) Attorney, Agent, or Firm—Foley & Lardner LLP

(57) ABSTRACT

In an optical device such as an optical sensor or a solid-state imaging device having a photodiode for receiving light and producing photocharges and a transfer transistor (or an overflow gate) for transferring the photocharge, it is configured that photocharges overflowing from the photo diode in storage operation are stored into a plurality of storage capacitance elements through the transfer transistor or the overflow gate, thereby obtaining the optical device adapted to maintain a high sensitivity and a high S/N ratio and having a wide dynamic range.

7 Claims, 17 Drawing Sheets

FOREIGN PATENT DOCUMENTS

| | | |
|---|---|---|
| JP | 6-244403 | 9/1994 |
| JP | 2000-165754 A | 6/2000 |
| JP | 2002-077737 A | 3/2002 |
| JP | 2003-101881 A | 4/2003 |
| JP | 2003-134396 A | 5/2003 |
| JP | 2003-209242 A | 7/2003 |
| JP | 2004-335802 A | 11/2004 |

OTHER PUBLICATIONS

Y. Muramatsu et al., "A Signal-Processing CMOS Image Sensor Using a Simple Analog Operation," IEEE Journal of Solid-State Circuits, vol. 38:1, Jan. 2003, pp. 101-106.

The Journal of the Institute of Image Information and Television Engineers, vol. 57, 2003.

* cited by examiner

[Fig. 1]
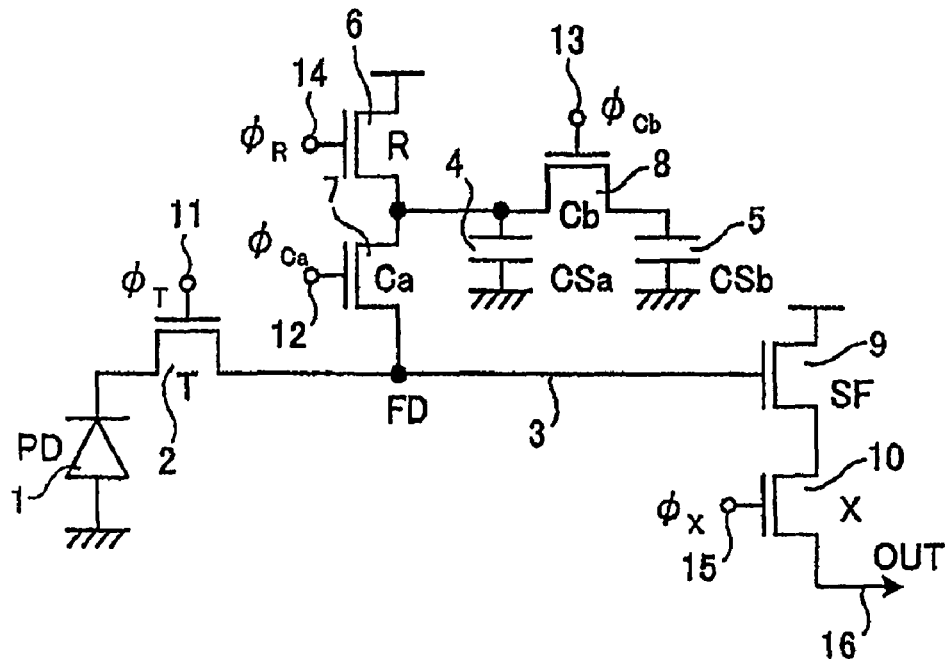
[Fig. 2]
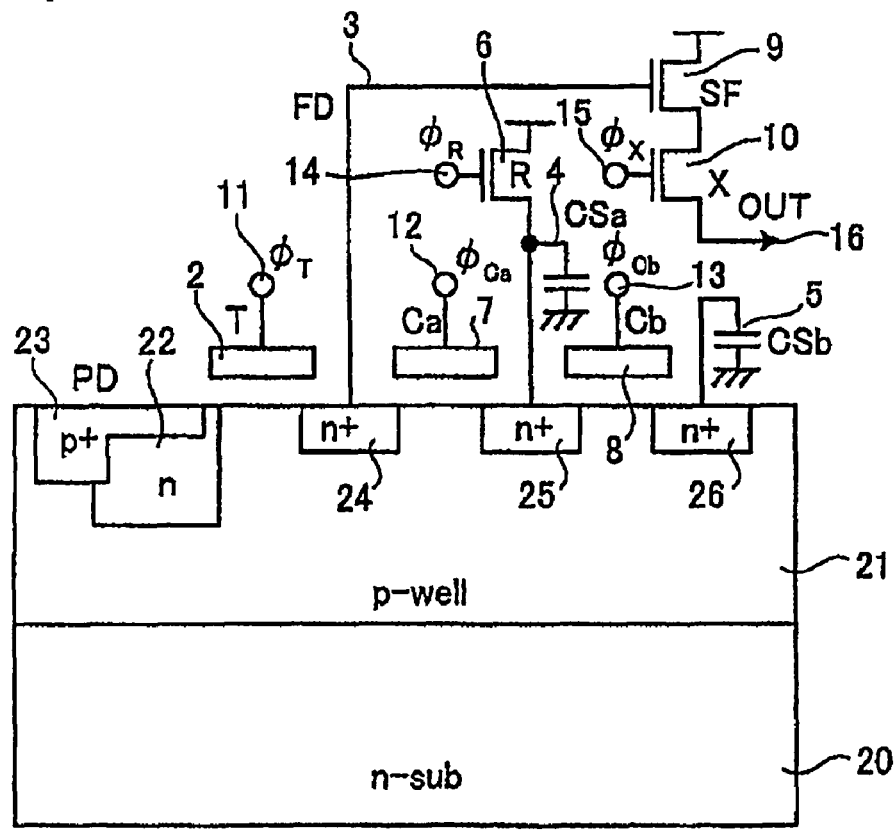

[Fig. 3]
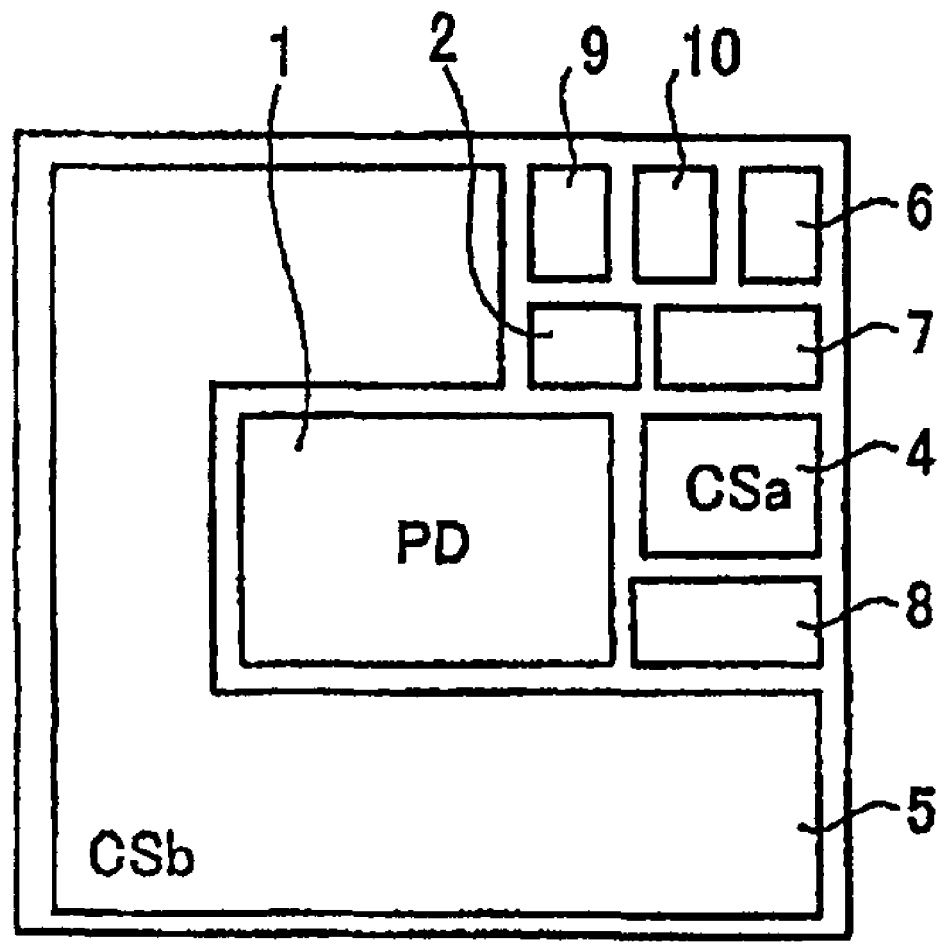

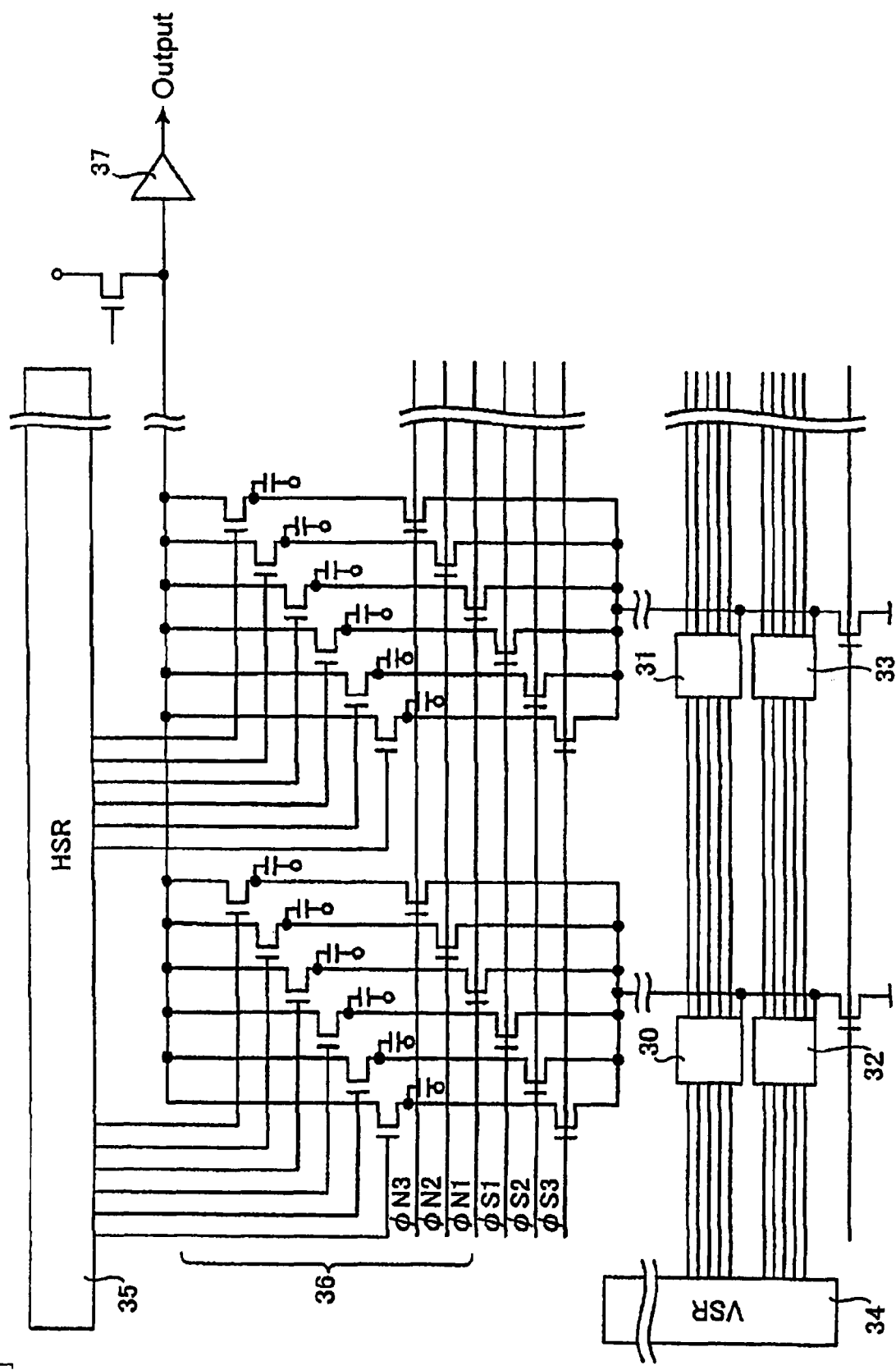
[Fig. 4]

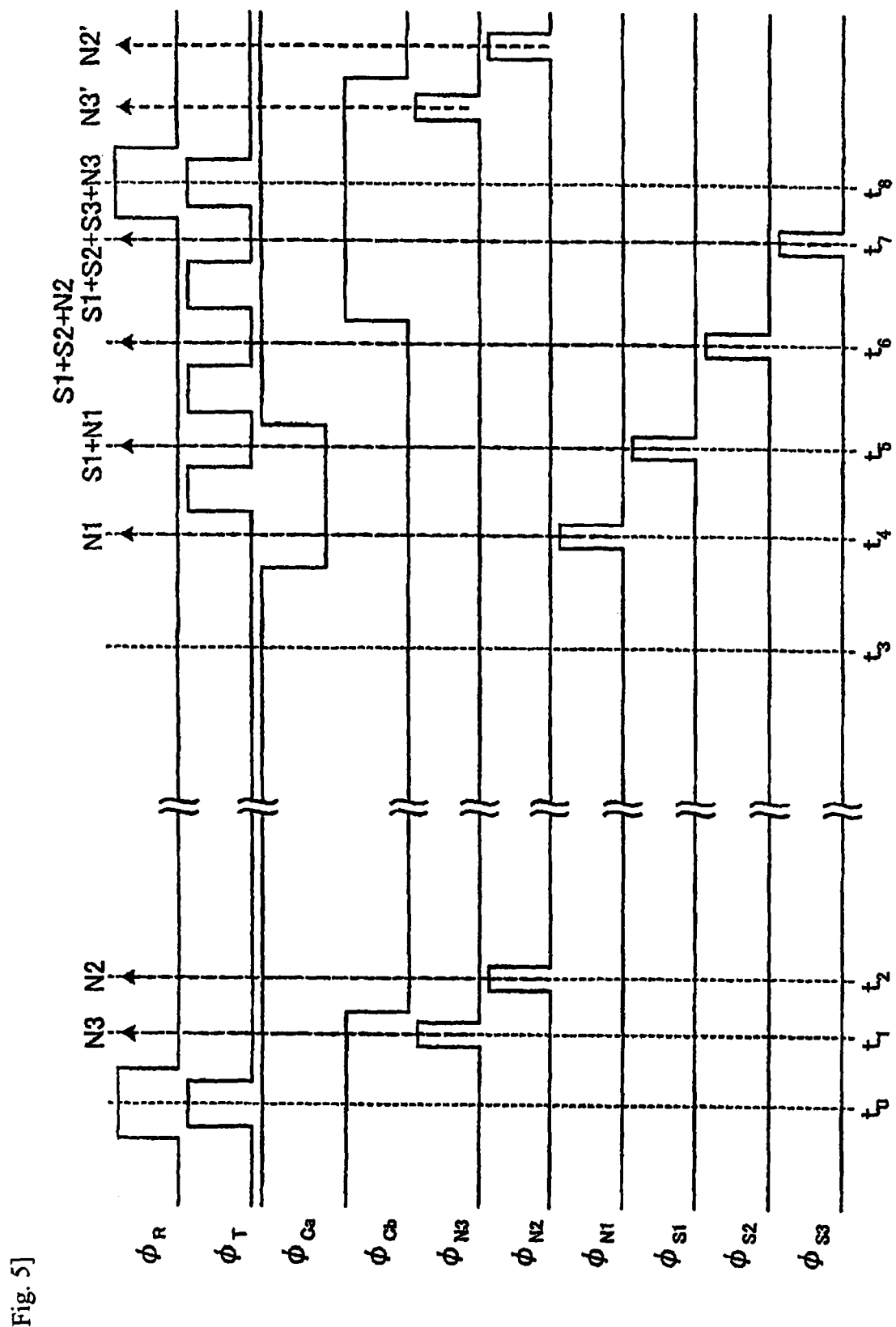
[Fig. 5]

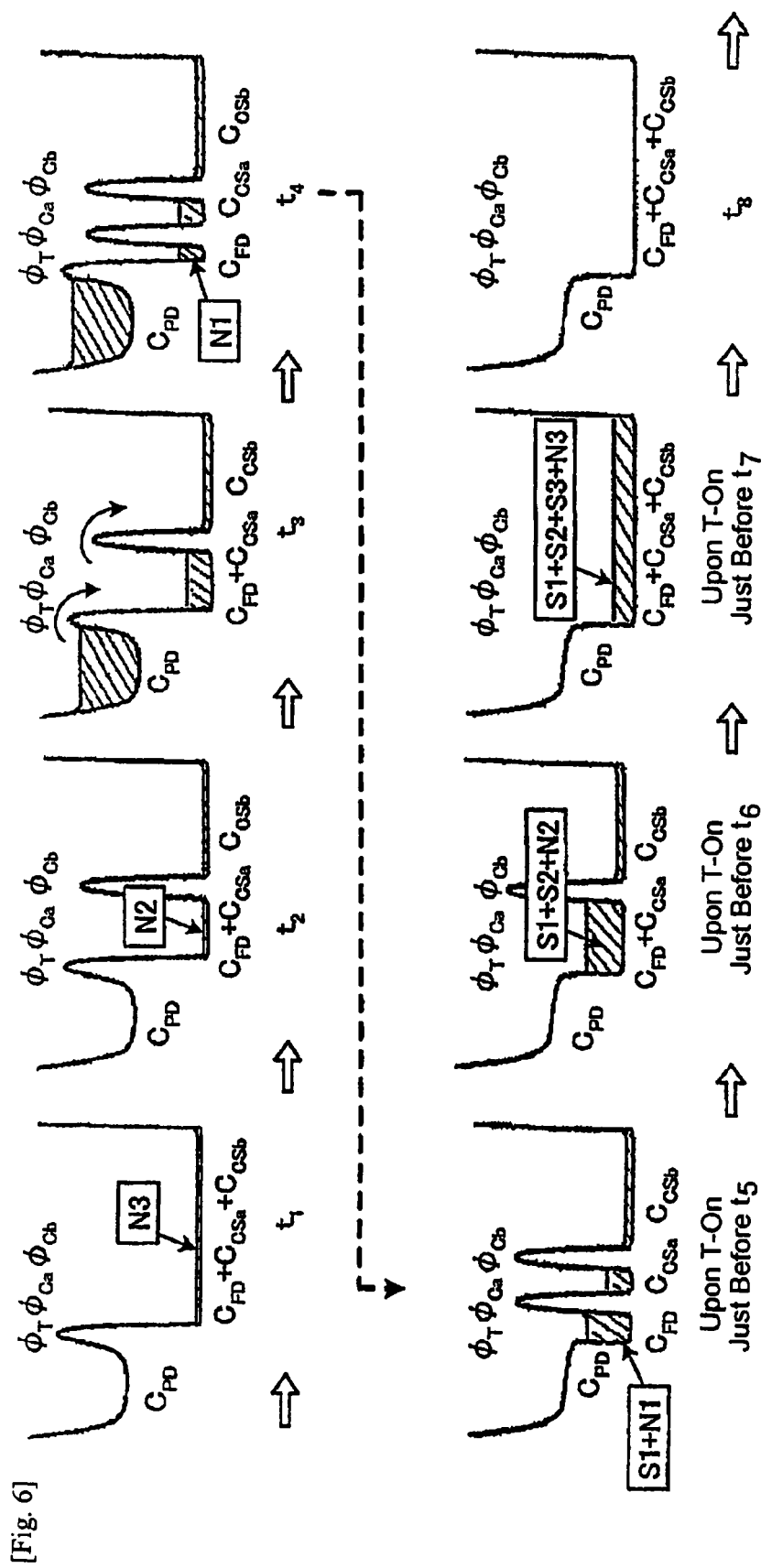
[Fig. 6]

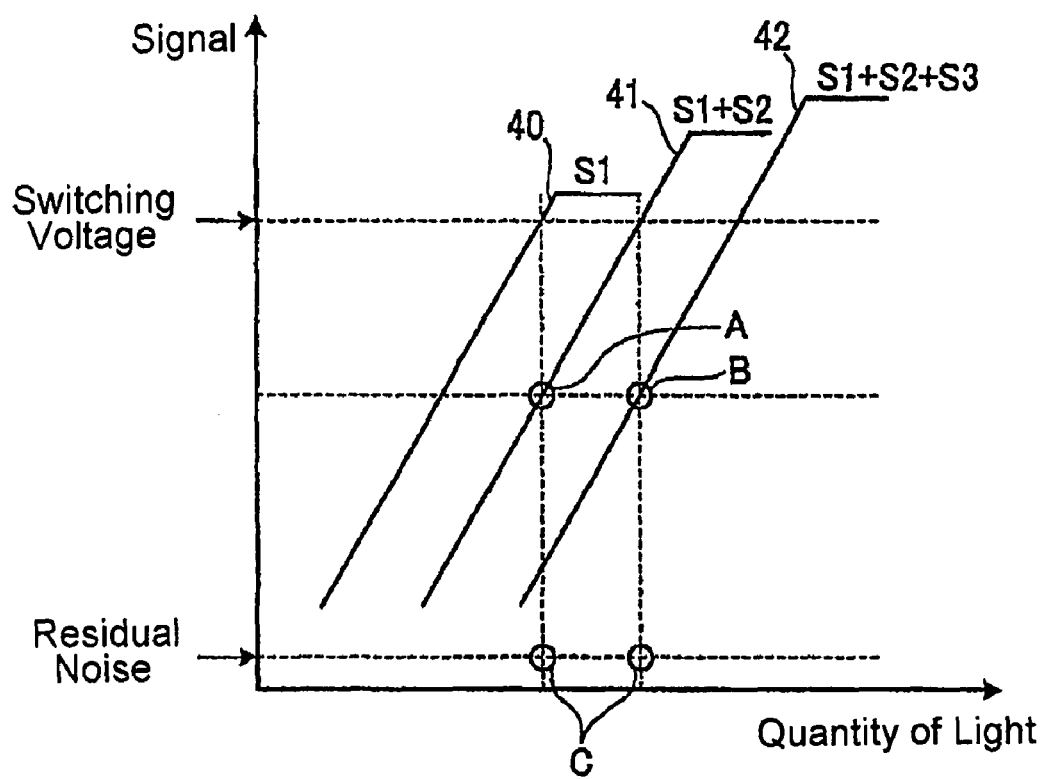
[Fig. 7]

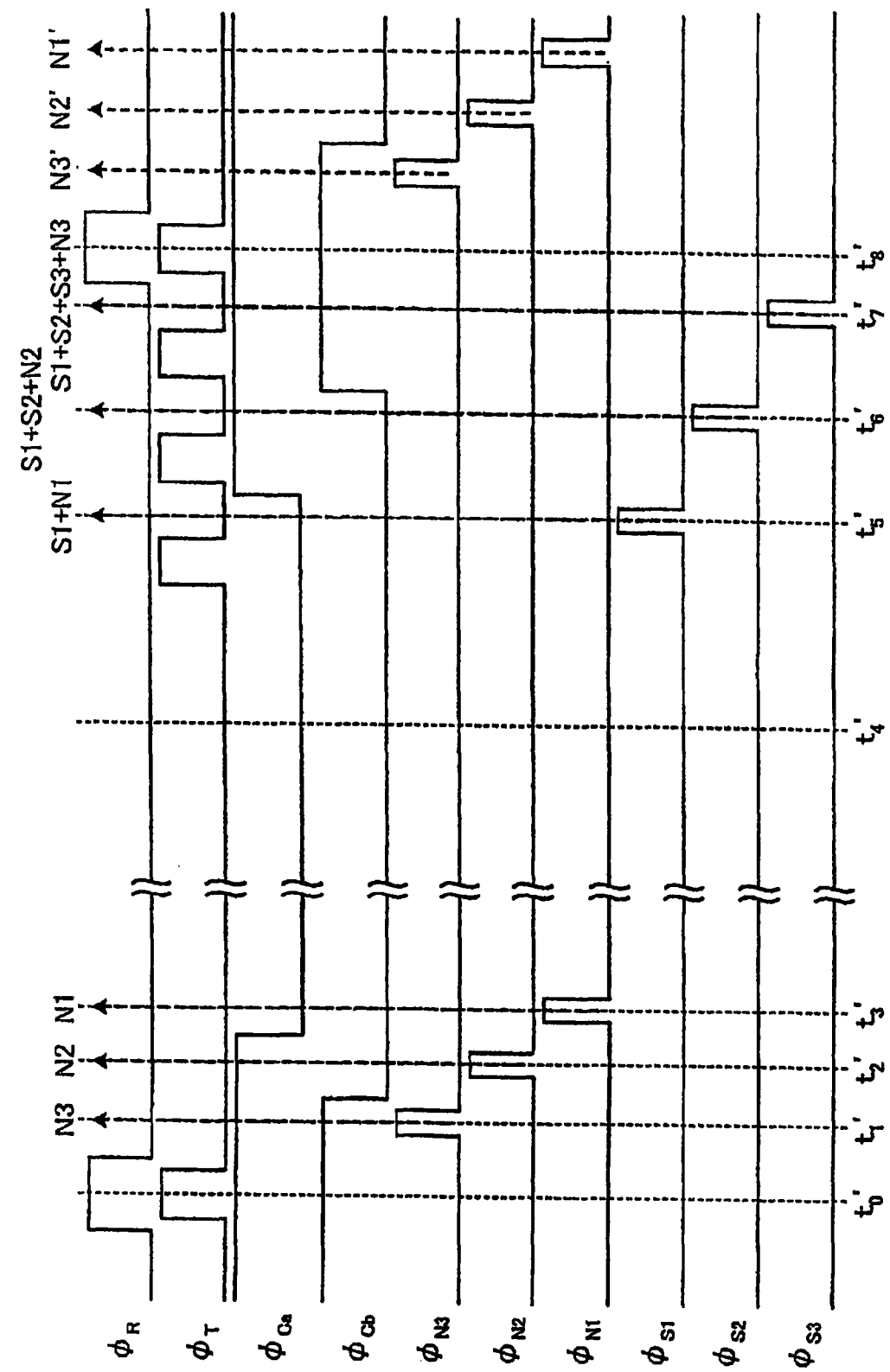
[Fig. 8]

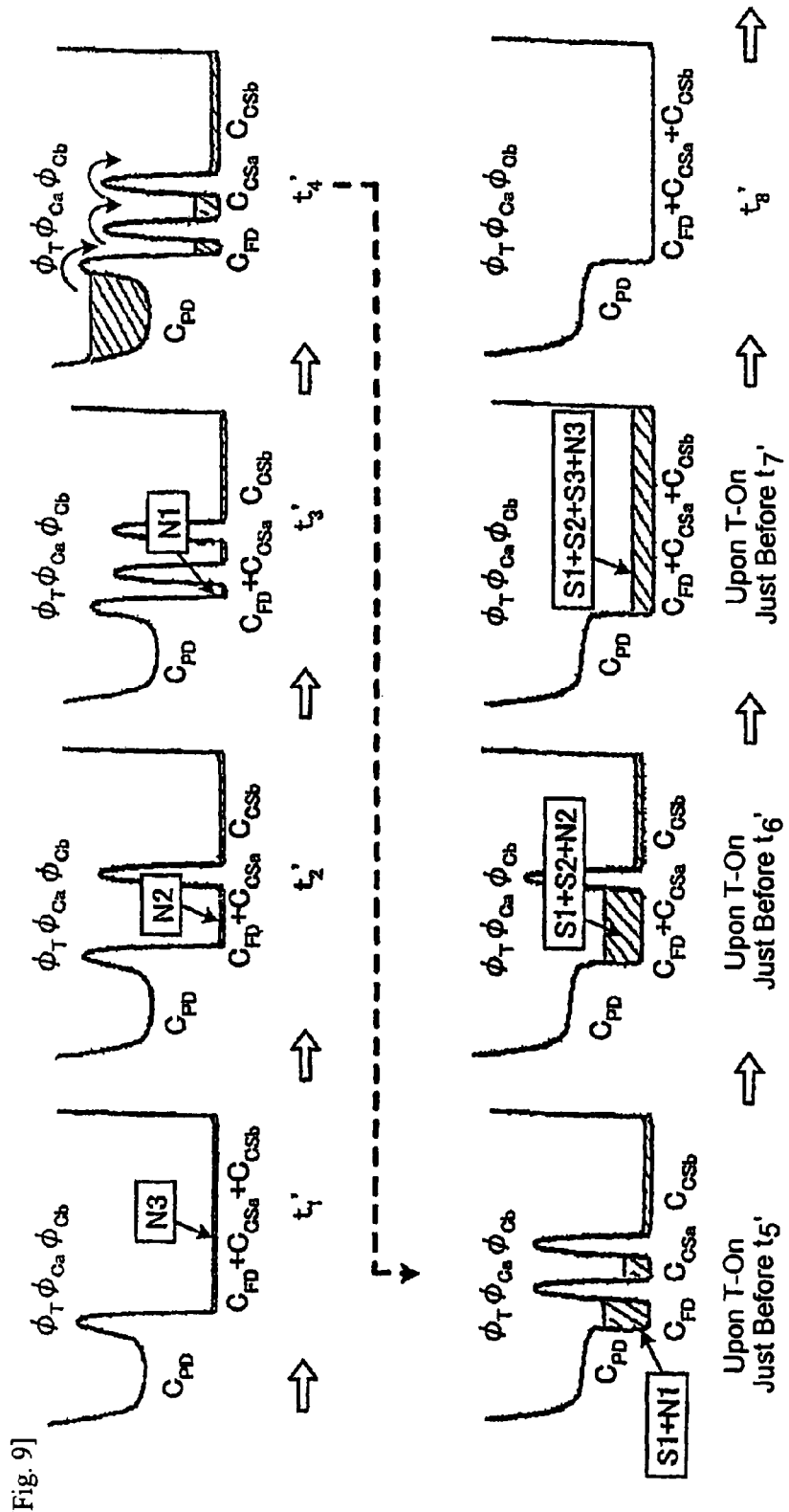
[Fig. 9]

[Fig. 10]
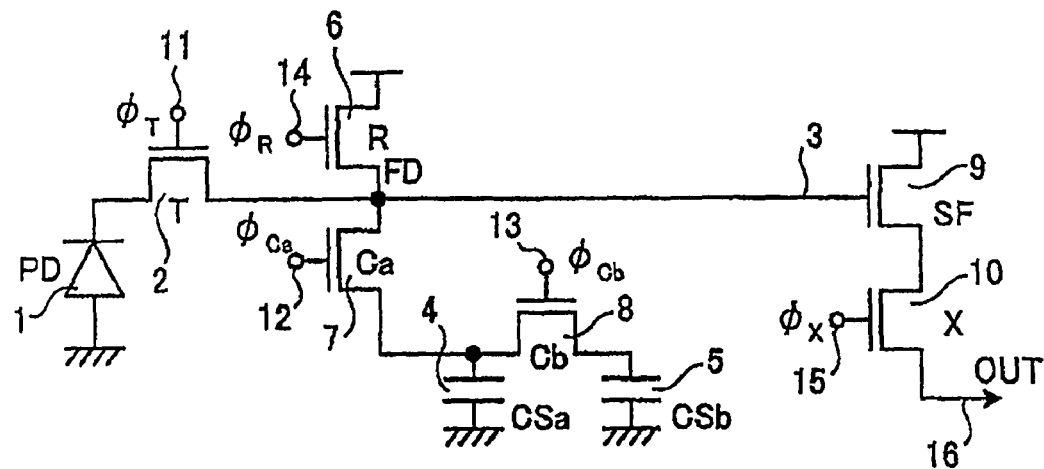
[Fig. 11]
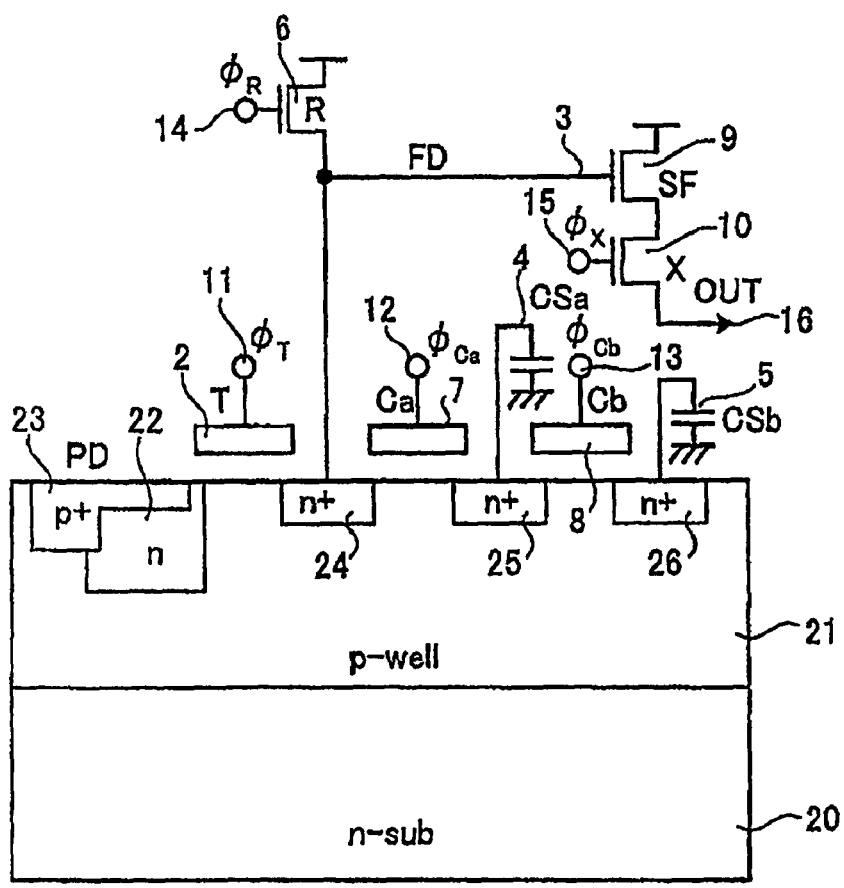

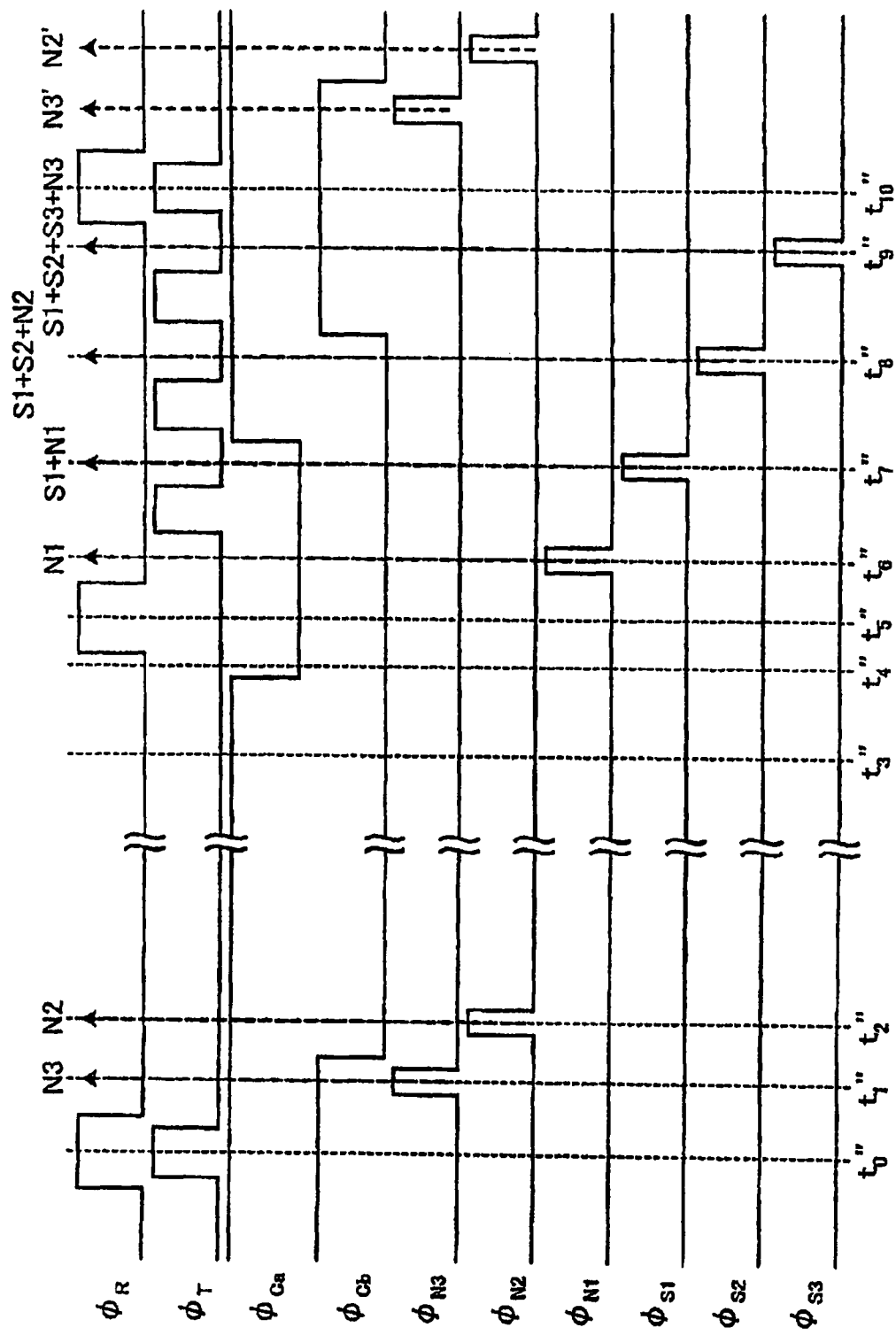
[Fig. 12]

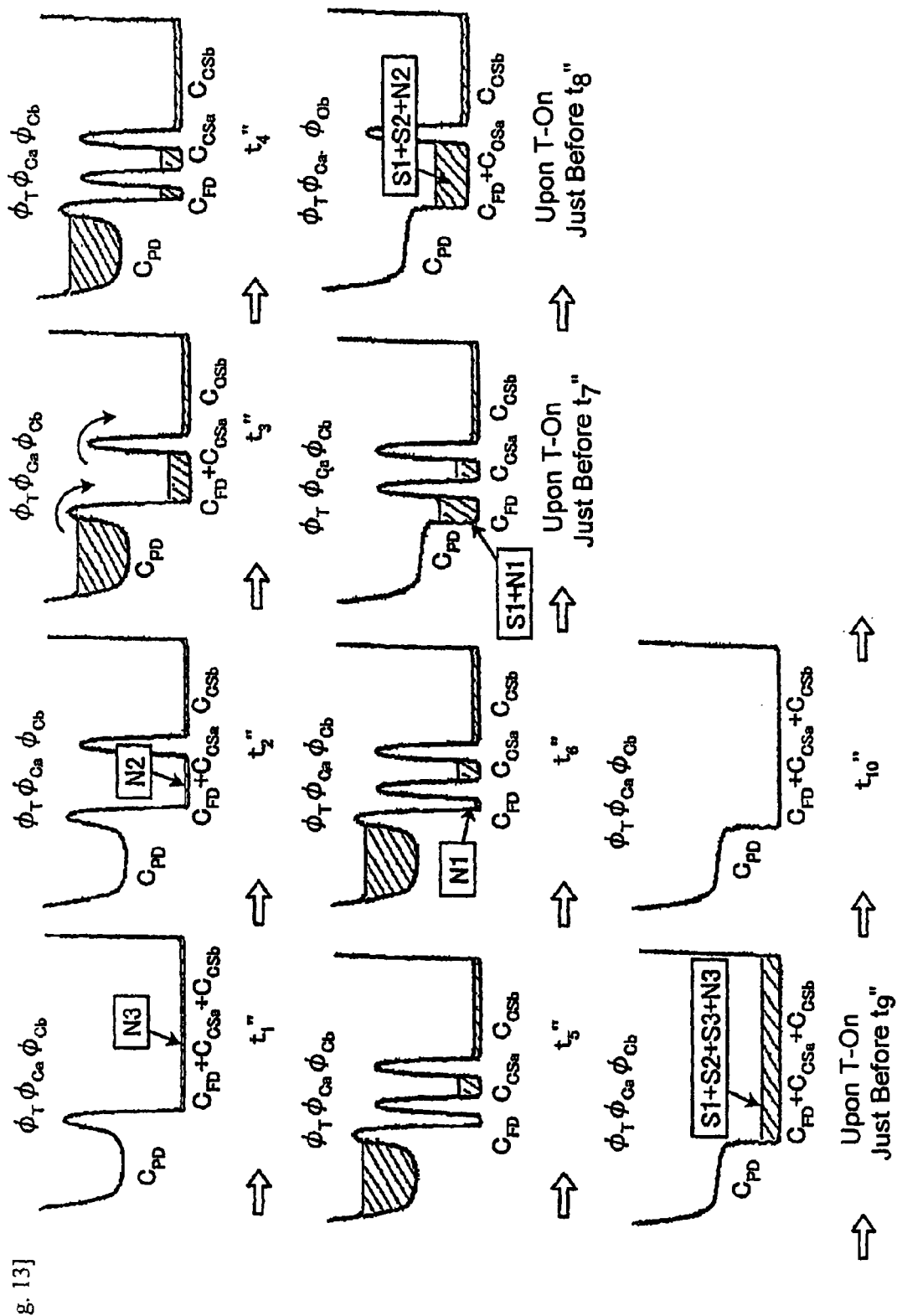
[Fig. 13]

[Fig. 14]
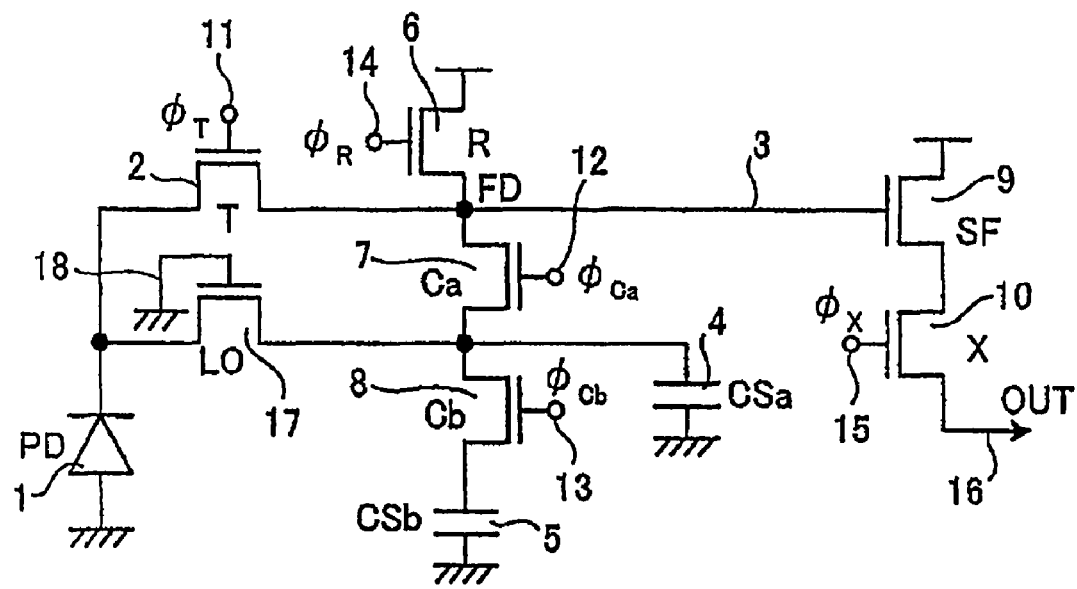
[Fig. 15-1]
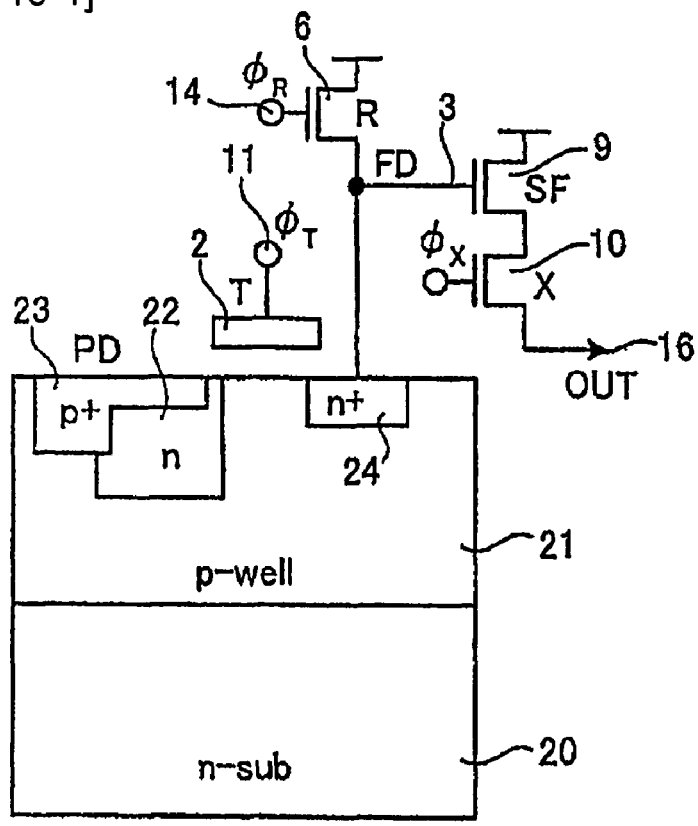

[Fig. 15-2]
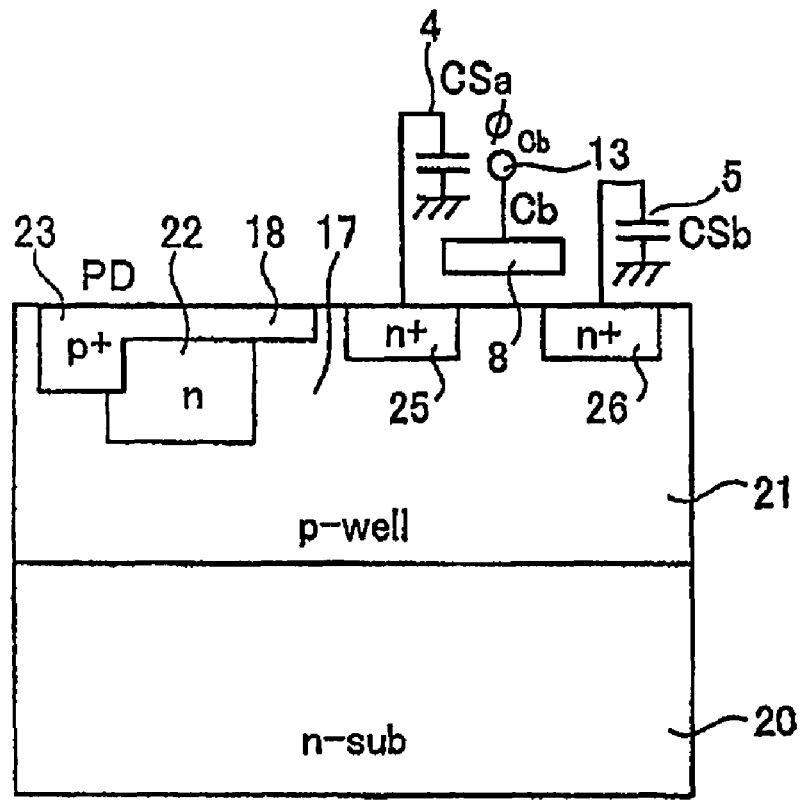
[Fig. 16]
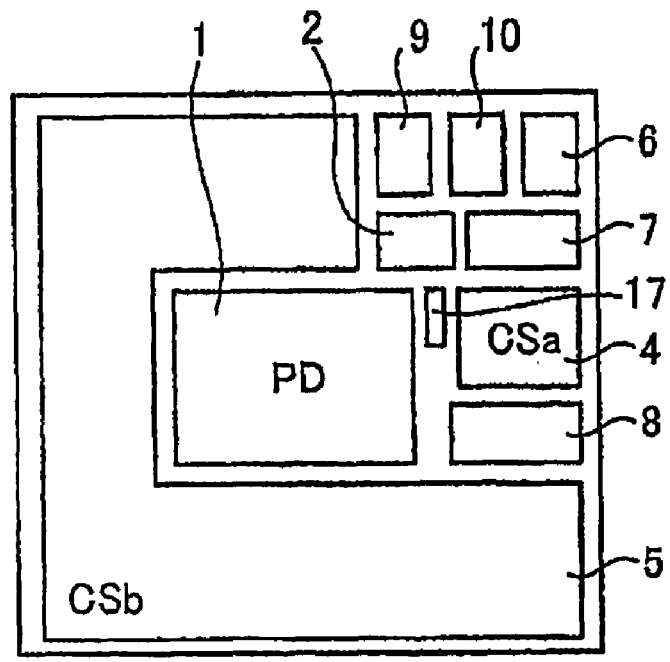

[Fig. 17]
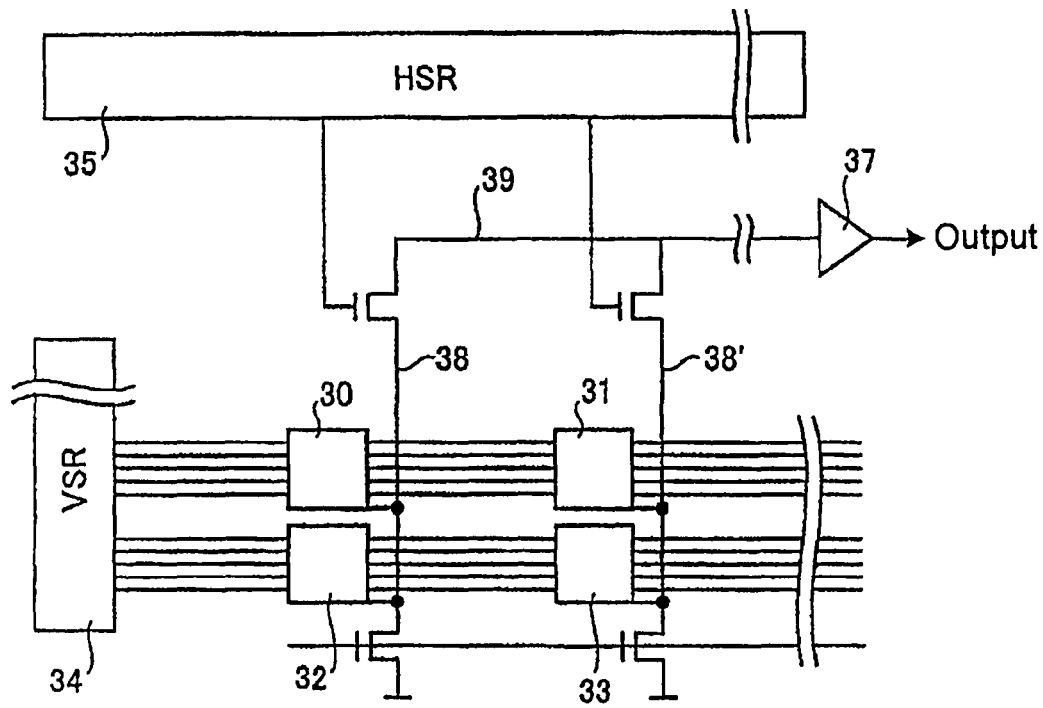
[Fig. 18]
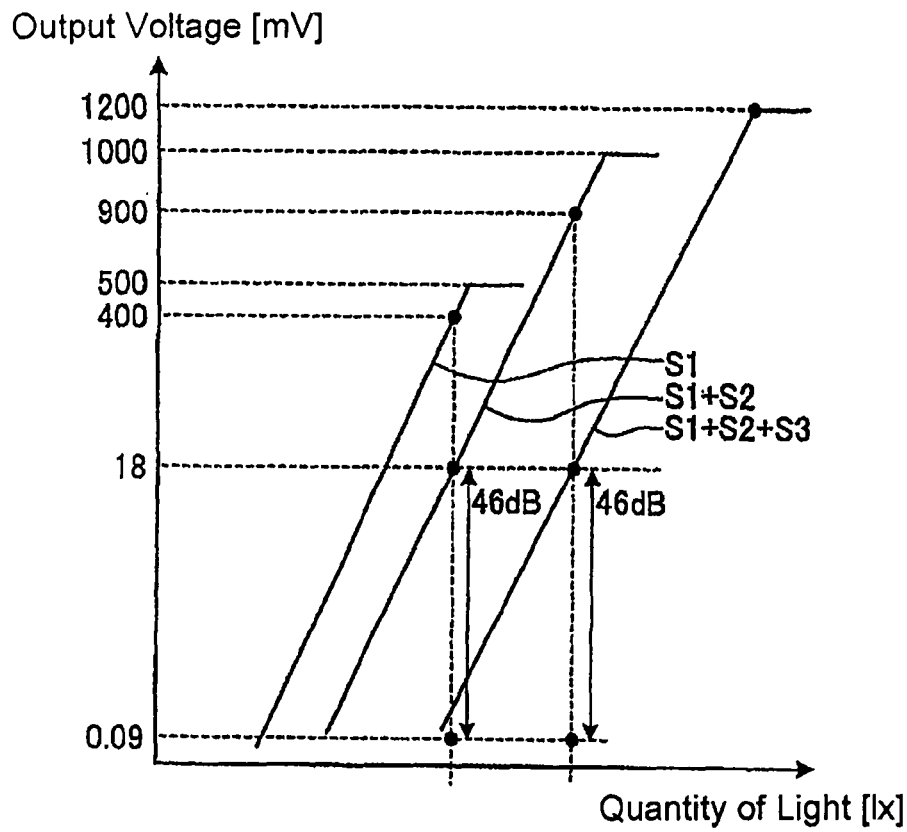

[Fig. 19]
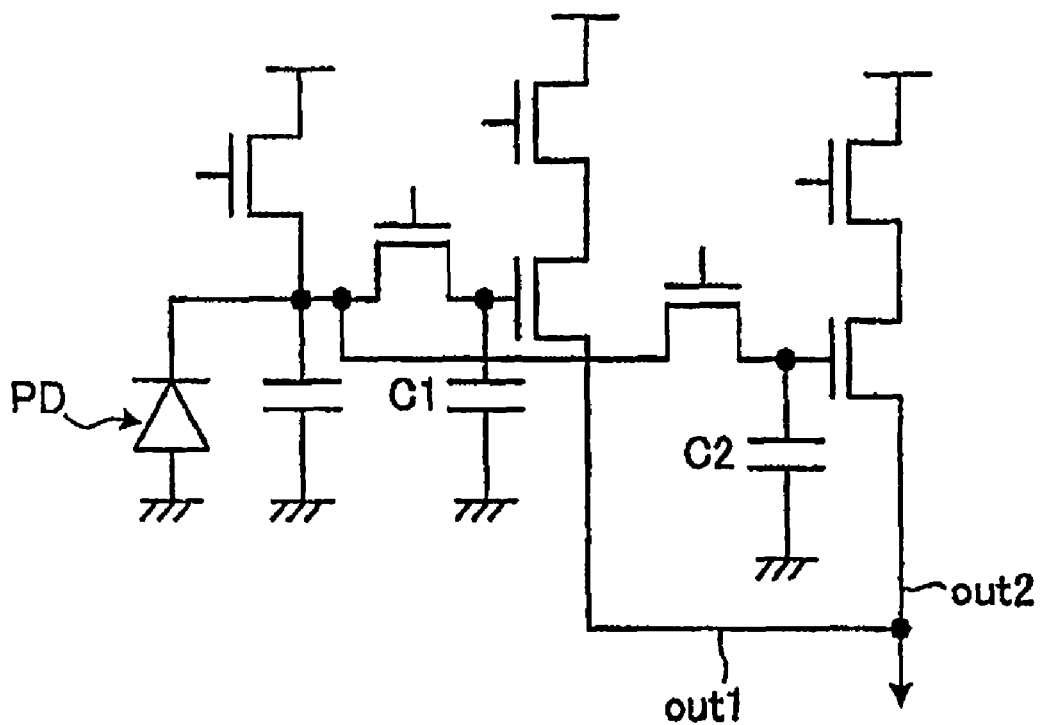
[Fig. 20]
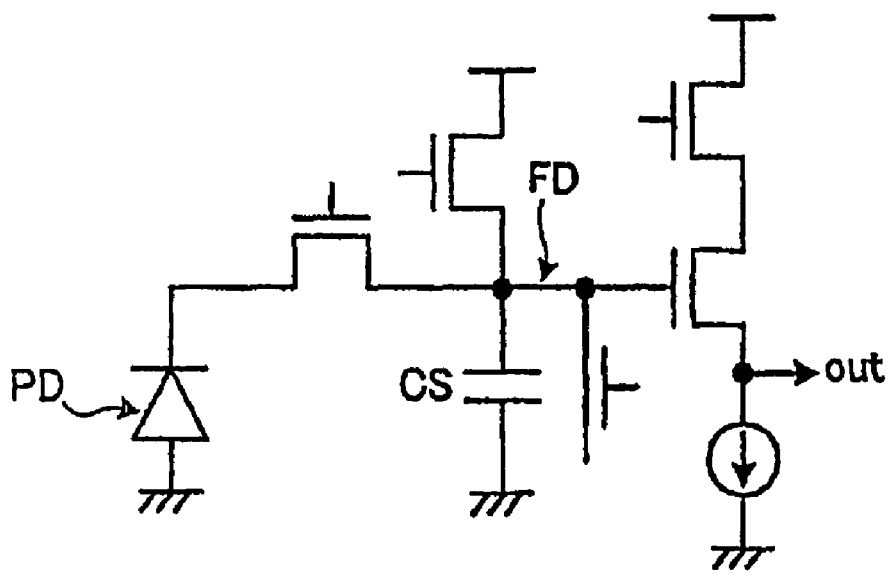

[Fig. 21]
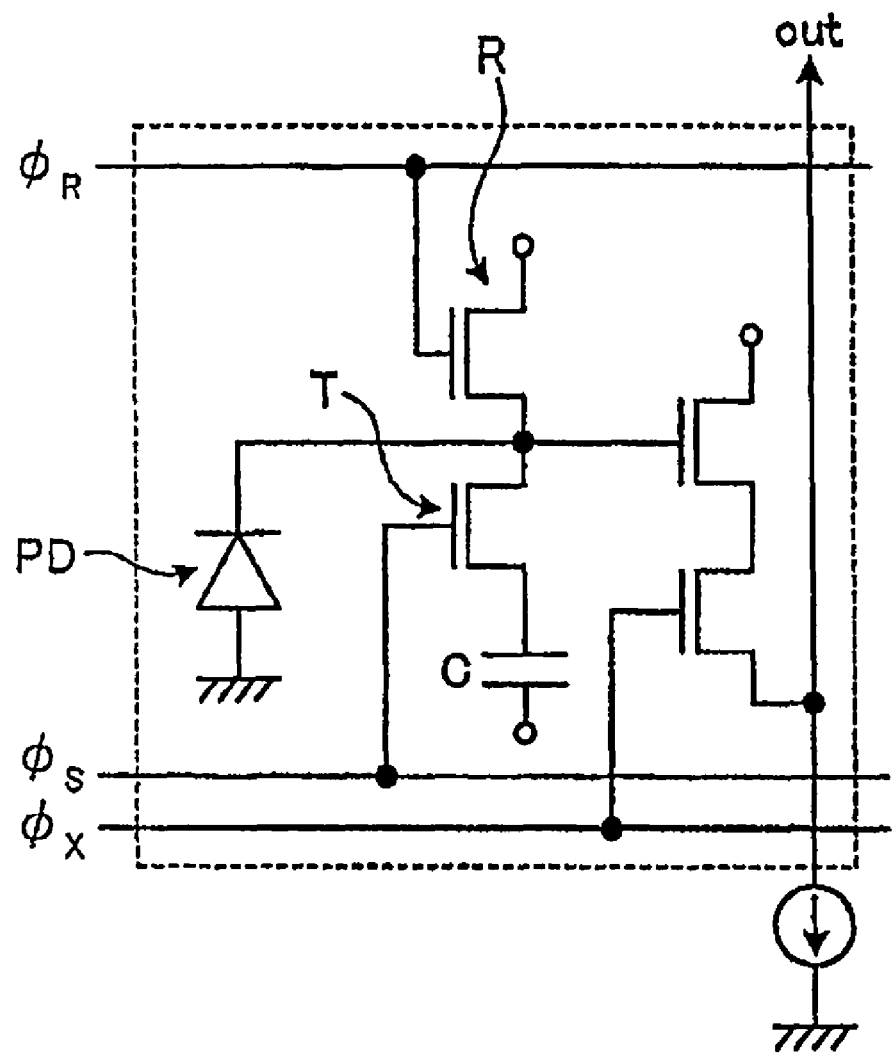
[Fig. 22]
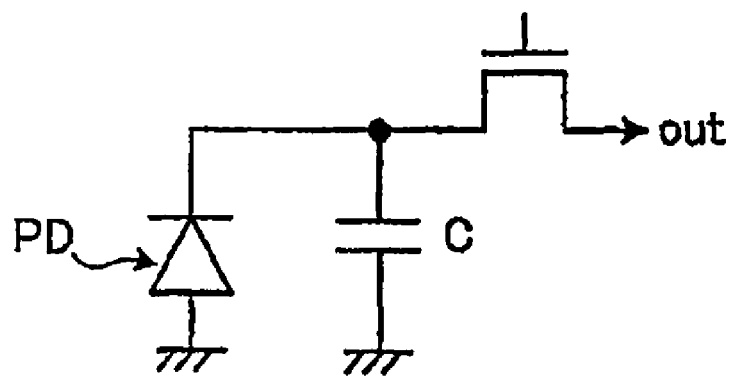

[Fig. 23]
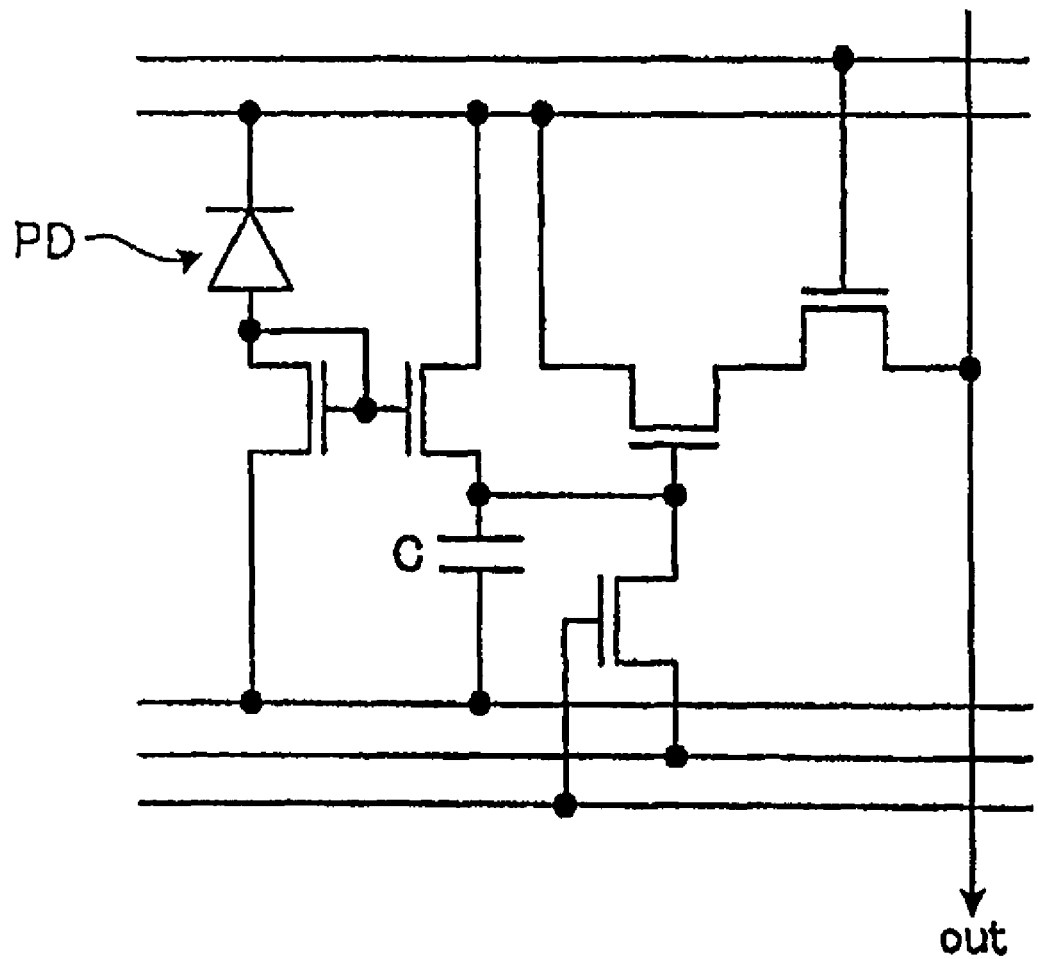

OPTICAL SENSOR, SOLID-STATE IMAGING DEVICE, AND OPERATING METHOD OF SOLID-STATE IMAGING DEVICE

This application is the National Phase of PCT/JP2006/307349, filed Apr. 6, 2006, which claims priority to Japanese Application No. 2005-111071, filed Apr. 7, 2005. The contents of the foregoing applications are incorporated by reference in their entirety.

TECHNICAL FIELD

This invention relates to an optical device such as an optical sensor or a solid-state imaging device and its operating method and, in particular, relates to a two-dimensional or one-dimensional solid-state imaging device of a CMOS type or a CCD type and an operating method of such a solid-state imaging device.

BACKGROUND ART

Image sensors such as CMOS (Complementary Metal-Oxide-Semiconductor) image sensors and CCD (Charge Coupled Device) image sensors, with the improvement in their characteristics, have been widely used in applications such as digital cameras, portable telephones with cameras, and scanners.

Further improvement of characteristics has been desired for the image sensors and one of them is to widen the dynamic range. The dynamic range of the conventionally used image sensors is staying, for example, within a range of 3 to 4 digits (60 to 80 dB) and it has been desired to realize a high quality image sensor having a dynamic range of 5 to 6 digits (100 to 120 dB) or more comparable to the naked eye or a silver-halide film.

As a technique for improving the foregoing image sensor quality characteristics, for example, Non-Patent Document 1 discloses a technique in which, in order to increase the sensitivity and the S/N ratio, a noise signal generated by a floating diffusion adjacent to a photodiode of each pixel and a signal obtained by adding an optical signal to the noise signal are respectively read and a difference therebetween is derived, thereby suppressing noise.

However, even by this method, the dynamic range is about 80 dB or less, and it has been desired to achieve a wider dynamic range.

For example, Patent Document 1 discloses a technique in which, as shown in FIG. 19, a floating diffusion of a small capacitance C1 on the high-sensitivity low-illumination side and a floating diffusion of a large capacitance C2 on the low-sensitivity high-illumination side are coupled to a photodiode PD to out a low-illumination side output OUT1 and a high-illumination side output OUT2, respectively, thereby widening the dynamic range.

Further, Patent Document 2 discloses a technique in which, as shown in FIG. 20, a capacitance CS of a floating diffusion FD is variable, thereby widening the dynamic range. In addition, it discloses a technique in which imaging with a short exposure time adapted to high illumination and imaging with a long exposure time adapted to low illumination are performed, thus widening the dynamic range by division into two or more mutually different exposure times.

Further, Patent Document 3 or Non-Patent Document 2 discloses a technique in which, as shown in FIG. 21, a transistor switch T is provided between a photodiode PD and a capacitance C and the switch T is turned on in a first exposure period to store photosignal charges in both the photodiode PD and the capacitance C and is turned off in a second exposure period to store photocharges in the photodiode PD in addition to the stored charge, thereby widening the dynamic range. In this example, when there occurs light irradiation exceeding saturation, the excess charges are drained through a reset transistor R.

Further, Patent Document 4 discloses a technique in which, as shown in FIG. 22, a capacitance C larger than a conventional one is used as a photodiode PD, thereby enabling adaptation to high-illumination imaging.

Further, Non-Patent Document 3 discloses a technique in which, as shown in FIG. 23, a photocurrent signal from a photodiode PD is stored and output while logarithmically converting it using a logarithmic conversion circuit formed by combining MOS transistors, thereby widening the dynamic range.

Patent Document 1: Japanese Unexamined Patent Application Publication (JP-A) No. 2003-134396
Patent Document 2: Japanese Unexamined Patent Application Publication (JP-A) No. 2000-165754
Patent Document 3: Japanese Unexamined Patent Application Publication (JP-A) No. 2002-77737
Patent Document 4: Japanese Unexamined Patent Application Publication (JP-A) No. Hei 5-90556
Non-Patent Document 1: S. Inoue et al., IEEE Workshop on CCDs and Advanced Image Sensor 2001, pp. 16-19
Non-Patent Document 2: Y. Muramatsu et al., IEEE Journal of Sold-state Circuits, Vol. 38, No. 1, 2003
Non-Patent Document 3: The Journal of the Institute of Image Information and Television Engineers, Vol. 57, 2003

DISCLOSURE OF THE INVENTION

Problem to be Solved by the Invention

However, in the foregoing method described in Patent Document 1, 2, or 3 or Non-Patent Document 2 or the method of imaging with the two or more different exposure times, there is a problem that since the low-illumination imaging and the high-illumination side imaging are carried out at different times, a lag occurs in imaging time to impair the quality of animation imaging.

Further, in the foregoing method described in Patent Document 4 or Patent Document 3, there is a problem that although the wide dynamic range can be achieved by adaptation to the high-illumination side imaging, the low-illumination side imaging results in low sensitivity and low S/N ratio and thus is impaired in quality.

As described above, it has been difficult to achieve the wide dynamic range while maintaining the high sensitivity and the high S/N ratio in the image sensors such as the CMOS image sensors. This is not limited to an image sensor having pixels arranged in a two-dimensional array, but also applies to a linear sensor having pixels arranged one-dimensionally or an optical sensor that does not have a plurality of pixels.

This invention has been made in view of the foregoing circumstances and has an object to provide a solid-state imaging element that can widen the dynamic range while maintaining the high sensitivity and the high S/N ratio, and an operating method thereof.

Means for Solving the Problem

An optical sensor according to an aspect of this invention is characterized by comprising a photodiode for receiving light and producing photocharges, a transfer transistor coupled to said photodiode for transferring said photocharges, and a plurality of storage capacitance elements for storing photocharges overflowing from said photodiode through said transfer transistor in storage operation.

A solid-state imaging device according to an aspect of this invention is characterized by having a plurality of pixels integrated in a one-dimensional or two-dimensional array, each of said plurality of pixels comprising a photodiode for receiving light and producing photocharges, a transfer transistor coupled to said photodiodes for transferring said photocharges, and a plurality of storage capacitance elements for storing photocharges overflowing from said photodiode through said transfer transistor in storage operation.

A solid-state imaging device according to an aspect of this invention is characterized by having a plurality of pixels integrated in a one-dimensional or two-dimensional array, each of said plurality of pixels comprising a photodiode for receiving light and producing photocharges, a transfer transistor coupled to said photodiode for transferring said photocharges, and a group of storage capacitance elements comprising a plurality of storage capacitance elements including at least a first and a second storage capacitance element for sequentially storing photocharges overflowing from said photodiode through said transfer transistor in storage operation.

A solid-state imaging device according to an aspect of this invention is characterized by having a plurality of pixels integrated in a one-dimensional or two-dimensional array, each of said plurality of pixels comprising a photodiode for receiving light and producing photocharges, a transfer gate coupled to said photodiode for transferring said photocharges, a first storage gate coupled to said transfer gate, a first storage capacitance element for storing photocharges overflowing from said photodiode through said transfer gate and said first storage gate in storage operation, and a second storage capacitance element coupled to said first storage capacitance element through a second storage gate.

The solid-state imaging device of this invention mentioned above is characterized in that said plurality of storage capacitance elements are coupled to each other through storage gate means.

The solid-state imaging device of this invention mentioned above preferably has the pixel which further comprises a floating region to which said photocharges are transferred through said transfer transistor.

The solid-state imaging device of this invention mentioned above preferably the pixel which further comprises a floating region to which said photocharges are transferred through said transfer gate.

The solid-state imaging device of this invention mentioned above preferably might have the second storage capacitance element greater in capacitance than the first storage capacitance element.

The solid-state imager of this invention mentioned above may be structured by the plurality of the storage capacitance element having the same capacitance.

The solid-state imaging device of this invention mentioned above further comprises a reset transistor coupled to said floating region or to at least one of said first and second storage capacitance elements for draining signal charges out of said first and second storage capacitance elements and said floating region, an amplifying transistor for reading, as a voltage, signal charges of said floating region or signal charges of said floating region and at least one of said first and second storage capacitance elements, and a selection transistor coupled to said amplifying transistor for selecting said pixel.

The solid-state imaging device of this invention mentioned above further comprises noise canceling means for deriving a difference between a voltage signal obtained from one or more of said floating region, said first storage capacitance element and said second storage capacitance element and a voltage signal obtained from the photocharges transferred to said one or more of said floating region, said first storage capacitance element and said second storage capacitance element by transferring the photocharges from said photodiode to said floating region and turning on at least one of said first storage gate and said second storage gate.

A solid-state imaging device according to another aspect of this invention has a plurality of pixels integrated in a one-dimensional or two-dimensional array, each of said plurality of pixels comprising at least a photodiode for receiving light and producing photocharges, a transfer transistor coupled to said photodiode for transferring said photocharges, a floating region to which said photocharges are transferred through said transfer transistor, a first storage transistor coupled to said transfer transistor, a first storage capacitance element for storing photocharges overflowing from said photodiode through said transfer transistor and said first storage transistor in storage operation, a second storage transistor for transferring photocharges overflowing from said first storage capacitance element, and a second storage capacitance element for storing the photocharges overflowing from said first storage capacitance element through said second storage transistor.

According to a further aspect of this invention, a solid-state imaging device operating method of the solid-state imaging device mentioned above comprises a step of, before charge storage, turning on said first and second storage transistors to drain photocharges out of said floating region and said first and second storage capacitance elements, a step of storing before-saturation charges in photocharges produced by said photodiode, in said photodiode and storing supersaturation charges overflowing from said photodiode into said floating region and said first storage capacitance element, a step of turning off said first storage transistor to drain the photocharges out of said floating region, a step of turning on said transfer transistor to transfer said before-saturation charges to said floating region, thereby reading a before-saturation signal indicative of a voltage signal of said before-saturation charges, a step of turning on said first storage transistor, thereby reading a first supersaturation signal indicative of a voltage signal of the sum of said before-saturation charges and said supersaturation charges having overflowed from said photodiode, and a step of turning on said second storage transistor, thereby reading a second supersaturation signal indicative of a voltage signal of the sum of said before-saturation charges, said supersaturation charges having overflowed from said photodiode, and supersaturation charges having overflowed from said first storage capacitance element.

The solid-state imaging device operating method of this invention mentioned above further comprises an output signal selection step of selecting at least one of said before-saturation signal, said first supersaturation signal and said second supersaturation signal by comparison with a predetermined reference voltage.

The solid-state imaging device operating method of this invention mentioned above preferably comprises the output signal selection step which selects said first supersaturation signal as an output signal when said before-saturation signal is greater than a first reference voltage and selects said second supersaturation signal as an output signal when said first supersaturation signal is greater than a second reference voltage.

An optical sensor according to a still another aspect of this invention is characterized by a structure which comprises a photodiode for receiving light and producing photocharges, a transfer transistor coupled to said photodiode for transferring said photocharges, an overflow gate coupled to said photodiode, and a plurality of storage capacitance elements for storing photocharges overflowing from said photodiode through said overflow gate in storage operation.

A solid-state imaging device according to another aspect of this invention is characterized by having a plurality of pixels integrated in a one-dimensional or two-dimensional array, each of said plurality of pixels comprising a photodiode for receiving light and producing photocharges, a transfer transistor coupled to said photodiode for transferring said photocharges, an overflow gate coupled to said photodiode, and a plurality of storage capacitance elements for storing photocharges overflowing from said photodiode through said overflow gate in storage operation.

A solid-state imaging device according to a yet another aspect of this invention is characterized by having a plurality of pixels integrated in a one-dimensional or two-dimensional array, each of said plurality of pixels comprising a photodiode for receiving light and producing photocharges, a transfer transistor coupled to said photodiode for transferring said photocharges, an overflow gate coupled to said photodiode, and a group of storage capacitance elements comprising a plurality of storage capacitance elements including at least a first and a second storage capacitance element for sequentially storing photocharges overflowing from said photodiode through said overflow gate in storage operation.

A solid-state imaging device according to a further aspect of this invention is characterized by having a plurality of pixels integrated in a one-dimensional or two-dimensional array, each of said plurality of pixels comprising a photodiode for receiving light and producing photocharges, a transfer gate coupled to said photodiode for transferring said photocharges, an overflow gate coupled to said photodiode for transferring photocharges overflowing from said photodiode in storage operation, a first storage gate coupled to said overflow gate, a first storage capacitance element for storing the photocharges overflowing from said photodiode through said overflow gate in the storage operation, a second storage gate coupled to said first storage capacitance element, and a second storage capacitance element coupled to said first storage capacitance element through said second storage gate.

The solid-state imaging device of this invention mentioned above preferably has the overflow gate which comprises a MOS transistor or a junction transistor.

The solid-state imaging device of this invention mentioned above is characterized in that said plurality of storage capacitance elements are coupled to each other through a storage transistor.

The solid-state imaging device of this invention mentioned above preferably has the pixel which further comprises a floating region to which said photocharges are transferred through said transfer transistor.

The solid-state imaging device of this invention mentioned above preferably has the pixel which further comprises a floating region to which said photocharges are transferred through said transfer gate.

The solid-state imaging device of this invention mentioned above preferably has the second storage capacitance element which has a capacitance larger than that of said first storage capacitance element.

The solid-state imaging device of this invention mentioned above preferably has the plurality of the storage capacitance elements having the same capacitance as each other.

The solid-state imaging device of this invention mentioned above further comprises a reset transistor coupled to said floating region or to at least one of said first and second storage capacitance elements for draining signal charges out of said first and second storage capacitance elements and said floating region, an amplifying transistor for reading, as a voltage, a signal charges of said floating region or signal charges of said floating region and at least one of said first and second storage capacitance elements, and a selection transistor coupled to said amplifying transistor for selecting said pixel.

A solid-state imaging device according to another aspect of this invention has a plurality of pixels integrated in a one-dimensional or two-dimensional array, each of said plurality of pixels comprising at least a photodiode for receiving light and producing photocharges, a transfer transistor coupled to said photodiode for transferring said photocharges, a floating region to which said photocharge are transferred through said transfer transistor, an overflow gate coupled to said photodiode, a first storage capacitance element for storing photocharges overflowing from said photodiode through said overflow gate in storage operation, a first storage transistor for transferring photocharges overflowing from said first storage capacitance element, a second storage capacitance element for storing the photocharges overflowing from said first storage capacitance element through said first storage transistor, and a second storage transistor connected between said floating region and said first storage capacitance element.

According to a still another aspect of this invention, a solid-state imaging device operating method of the solid-state imaging device mentioned above comprises a step of, before charge storage, turning on said first storage transistor and said second storage transistor to drain photocharges out of said floating region and said first and second storage capacitance elements, a step of storing before-saturation charges, of photocharges produced by said photodiode, in said photodiode and storing supersaturation charges overflowing from said photodiode into said first storage capacitance element through said overflow gate, a step of turning on said transfer transistor to transfer said before-saturation charges to said floating region, thereby reading a before-saturation signal indicative of a voltage signal of said before-saturation charges, a step of turning on said second storage transistor, thereby reading a first supersaturation signal indicative of a voltage signal of the sum of said before-saturation charges and said supersaturation charges having overflowed from said photodiode, and a step of turning on said first storage transistor, thereby reading a second supersaturation signal indicative of a voltage signal of the sum of said before-saturation charges, said supersaturation charges having overflowed from said photodiode, and supersaturation charges having overflowed from said first storage capacitance element.

The solid-state imaging device operating method of this invention mentioned above further comprises an output signal selection step of selecting at least one of said before-saturation signal, said first supersaturation signal, and said second supersaturation signal by comparison with a predetermined reference voltage.

The solid-state imaging device operating method of this invention mentioned above has the output signal selection step which selects said first supersaturation signal as an output signal when said before-saturation signal is greater than a first reference voltage and which selects said second supersaturation signal as an output signal when said first supersaturation signal is greater than a second reference voltage.

EFFECT OF THE INVENTION

According to a solid-state imaging device of this invention, the high sensitivity and the high S/N ratio are maintained in low illumination imaging by a photodiode adapted to receive light and to produce and store photocharges and, further, imaging in high illumination is carried out by storing photocharges overflowing from the photodiode into a plurality of storage capacitances, thereby enabling the dynamic range to be widened.

BRIEF DESCRIPTION OF THE DRAWINGS

[FIG. 1] An equivalent circuit diagram of one pixel of a solid-state imaging device according to a first embodiment of this invention.

[FIG. 2] A schematic sectional view of the solid-state imaging device according to the first embodiment of this invention.

[FIG. 3] A schematic plan view of one pixel of the solid-state imaging device according to the first embodiment of this invention.

[FIG. 4] A block diagram of the solid-state imaging device according to the first embodiment of this invention.

[FIG. 5] A main drive timing chart of the solid-state imaging device according to the first embodiment of this invention.

[FIG. 6] A schematic potential diagram of the solid-state imaging device according to the first embodiment of this invention.

[FIG. 7] A schematic diagram of the photoelectric conversion characteristics of the solid-state imaging device according to the first embodiment of this invention.

[FIG. 8] A drive timing chart of a solid-state imaging device according to a second embodiment of this invention.

[FIG. 9] A schematic potential diagram of the solid-state imaging device according to the second embodiment of this invention.

[FIG. 10] An equivalent circuit diagram of one pixel of a solid-state imaging device according to a third embodiment of this invention.

[FIG. 11] A schematic sectional view of the solid-state imaging device according to the third embodiment of this invention.

[FIG. 12] A drive timing chart of the solid-state imaging device according to the third embodiment of this invention.

[FIG. 13] A schematic potential diagram of the solid-state imaging device according to the third embodiment of this invention.

[FIG. 14] An equivalent circuit diagram of one pixel of a solid-state imaging device according to a fourth embodiment of this invention.

[FIG. 15-1] A schematic sectional view of the solid-state imaging device according to the fourth embodiment of this invention.

[FIG. 15-2] Another schematic sectional view of the solid-state imaging device according to the fourth embodiment of this invention.

[FIG. 16] A schematic plan view of one pixel of the solid-state imaging device according to the fourth embodiment of this invention.

[FIG. 17] A block diagram of a solid-state imaging device according to a fifth embodiment of this invention.

[FIG. 18] A diagram showing the photoelectric conversion characteristics of a solid-state imaging device according to Example 1 of this invention.

[FIG. 19] An equivalent circuit diagram of one pixel of a solid-state imaging device according to Patent Document 1 related to this invention.

[FIG. 20] An equivalent circuit diagram of one pixel of a solid-state imaging device according to Patent Document 2 related to this invention.

[FIG. 21] An equivalent circuit diagram of one pixel of a solid-state imaging device according to Patent Document 3 related to this invention.

[FIG. 22] An equivalent circuit diagram of one pixel of a solid-state imaging device according to Patent Document 4 related to this invention.

[FIG. 23] An equivalent circuit diagram of one pixel of a solid-state imaging device according to Non-Patent Document 3 related to this invention.

BEST MODE FOR CARRYING OUT THE INVENTION

Hereinbelow, embodiments of solid-state imaging devices of this invention will be described with reference to the drawings.

First Embodiment

FIG. 1 shows an equivalent circuit diagram of one pixel of a solid-state imaging device according to this embodiment, FIG. 2 shows a schematic sectional view thereof, and FIG. 3 shows a schematic plan view thereof.

Each pixel comprises a photodiode PD1 for receiving light and producing photocharges, a transfer transistor T2 provided adjacent to the photodiode PD1 for transferring photocharges, a floating diffusion FD3 provided so as to be coupled to the photodiode PD1 through the transfer transistor T2, a first storage capacitance CSa4 and a second storage capacitance CSb5 for storing, through the transfer transistor T2, photocharges overflowing from the photodiode PD1 upon exposure storage operation, a reset transistor R6 formed so as to be coupled to the first storage capacitance CSa4 for draining signal charges out of the first storage capacitance CSa4, the second storage capacitance CSb5, and the floating diffusion FD3, a first storage transistor Ca7 provided between the floating diffusion FD3 and the first storage capacitance CSa4, a second storage transistor Cb8 provided between the first storage capacitance CSa4 and the second storage capacitance CSb5, an amplifying transistor SF9 for reading, as a voltage, a signal charge of the floating diffusion FD3, a signal charge of the floating diffusion FD3 and the first storage capacitance CSa4, or a signal charge of the floating diffusion FD3, the first storage capacitance CSa4, and the second storage capacitance CSb5, and a selection transistor X10 provided so as to be coupled to the amplifying transistor for selecting the pixel or a pixel block.

In the solid-state imaging device according to this embodiment, the pixels each having the foregoing structure are integrated in a two-dimensional or one-dimensional array, wherein, in each pixel, drive lines φT11, φCa12, φCb13, and φR14 are respectively connected to gate electrodes of the transfer transistor T2, the first storage transistor Ca7, the second storage transistor Cb8, and the reset transistor R6, a pixel selection line φX15 driven by a row shift register is connected to a gate electrode of the selection transistor X10, and further, an output line OUT16 is connected to an output-side source of the selection transistor X10 so as to be output under the control of a column shift register.

In FIG. 2, for example, a p-type well (p-well) 21 is formed in an n-type silicon semiconductor substrate (n-sub) 20, further, an n-type semiconductor region 22 is formed in the p-type well 21, and a p$^+$-type semiconductor region 23 is formed in a surface layer of the n-type semiconductor region 22 and, by this pn junction, the charge transfer buried-type photodiode PD is formed. When light LT enters a depletion layer generated by applying a proper bias to the pn junction, photocharges are produced by a photoelectric effect.

The n-type semiconductor region 22 has at its end a region protruding from the p$^+$-type semiconductor region 23 and, spaced apart from this region by a predetermined distance, an n$^+$-type semiconductor region 24, which is to serve as the floating diffusion FD, is formed in a surface layer of the p-type well 21 and, spaced apart from this region by predetermined distances, an n$^+$-type semiconductor region 25 and further an n$^+$-type semiconductor region 26 are formed.

Herein, in a region related to the n-type semiconductor region 22 and the n$^+$-type semiconductor region 24, the gate electrode made of polysilicon or the like is formed on an upper surface of the p-type well 21 through a gate insulating film made of silicon oxide or the like, so that the transfer transistor T2 is formed having the n-type semiconductor region 22 and the n$^+$-type semiconductor region 24 as its source and drain and having a channel forming region in the surface layer of the p-type well 21.

Further, in a region related to the n$^+$-type semiconductor region 24 and the n$^+$-type semiconductor region 25, the gate electrode made of polysilicon or the like is formed on the upper surface of the p-type well 21 through a gate insulating film made of silicon oxide or the like, so that the storage transistor Ca is formed having the n$^+$-type semiconductor region 24 and the n$^+$-type semiconductor region 25 as its source and drain and having a channel forming region in the surface layer of the p-type well 21.

Furthermore, in a region related to the n$^+$-type semiconductor region 25 and the n$^+$-type semiconductor region 26, the gate electrode made of polysilicon or the like is formed on the upper surface of the p-type well 21 through a gate insulating film made of silicon oxide or the like, so that the storage transistor Cb is formed having the n$^+$-type semiconductor region 25 and the n$^+$-type semiconductor region 26 as its source and drain and having a channel forming region in the surface layer of the p-type well 21. Herein, a threshold voltage of the second storage transistor Cb is set lower than that of the transfer transistor T.

In FIG. 3, regions where the transfer transistor T2, the first storage capacitance CSa4, the second storage capacitance CSb5, the reset transistor R6, the first storage transistor Ca7, the second storage transistor Cb8, the amplifying transistor SF9, and the selection transistor X10 are formed are shown around the photodiode PD1. The floating diffusion FD3 is not shown, but is provided near the transfer transistor T2 and the first storage capacitance CSa4.

FIG. 4 shows a block diagram of the solid-state imaging device of this embodiment. A row shift register 34, a column shift register 35, a signal and noise holding section 36, and an output circuit 37 are provided at the peripheral portion of a two-dimensionally arranged pixel array (30, 31, 32, 33). Herein, the pixel array of 2 pixels×2 pixels is shown for simplification, but the number of pixels is not limited thereto.

Signals sequentially read from each pixel are a noise signal N1, an optical signal before saturation charge-voltage converted in FD plus the noise signal (S1+N1), a noise signal N2, a summed optical signal before and after the saturation charge-voltage converted in FD+CSa plus the noise signal (S1+S2+N2), a noise signal N3, and a summed optical signal before and after the saturation charge-voltage converted in FD+CSa+CSb plus the noise signal (S1+S2+S3+N3). The operation of noise removal (S1+N1)−N1, (S1+S2+N2)−N2, and (S1+S2+S3+N3)−N3 is performed using a subtraction circuit, thereby removing both random noise component and fixed pattern noise component. As will be described later, for adaptation to the case where one or more of the noise signals N1, N2 and N3 are read immediately after the start of storage, the noise signals are once stored in a frame memory and then the noise removal is carried out using the subtraction circuit. In this manner, the noise-removed before-saturation side signal S1 and supersaturation side signals S1+S2 and S1+S2+S3 are obtained.

The subtraction circuit and the frame memory may be either formed on an image sensor chip or formed as a separate chip.

A description will be given of an operating method of the solid-state imaging device of this embodiment described with reference to FIGS. 1 to 4. FIG. 5 is a main drive timing chart of the solid-state imaging device of this embodiment and FIG. 6 is a schematic potential diagram of a portion of the pixel from the photodiode, through the floating diffusion FD and the first storage capacitance, to the second storage capacitance.

Referring to FIGS. 5 and 6, at first, before exposure and storage, the first storage transistor Ca and the first storage transistor Cb are set to on, while the transfer transistor T and the reset transistor R are set to off. Then, the reset transistor R and the transfer transistor T are turned on to reset the floating diffusion FD, the first storage capacitance CSa, and the second storage capacitance CSb (time $t_0$). In this event, the photodiode PD is completely depleted. Then, reset noise of FD+CSa+CSb introduced immediately after turning off the reset transistor R is read as N3 (time $t_1$). In this event, the noise signal N3 contains threshold voltage variation of the amplifying transistor SF as a fixed pattern noise component.

Then, when the second storage transistor Cb is turned off, the signal charge stored in FD+CSa+CSb is distributed to FD+CSa and CSb according to their capacitance ratios. Of them, a signal distributed to FD+CSa is read as N2 (time $t_2$). In this event, N2 also contains the threshold voltage variation of the amplifying transistor SF as a fixed pattern noise component. In a storage period (time $t_3$), in the state where the first storage transistor Ca is on and the second storage transistor Cb, the reset transistor R, and the selection transistor X are off, photocharges before saturation of the photodiode PD are stored in the photodiode PD, while excess photocharges upon exceeding the saturation is stored in the floating diffusion FD and the first storage capacitance CSa so as to be superimposed on N2 through the transfer transistor T and the first storage transistor Ca. Further, excess photocharges upon exceeding saturation of the photodiode PD and the first storage capacitance CSa due to irradiation of stronger light is also stored in the second storage capacitance CSb through the second storage transistor Cb. Since the threshold voltage of the second storage transistor Cb is set lower than that of the transfer transistor T, when the floating diffusion FD and the first storage capacitance CSa are saturated, the excess charge does not return to the side of the photodiode PD, but is efficiently transferred to the second storage capacitance CSb. By this operation, the charge overflowing from the photodiode PD in the supersaturated state is effectively used without discarding it. In this manner, the storage operation is performed per pixel by receiving the light with the same photodiode PD and in the same period both before the saturation and after the supersaturation.

When the selection transistor X is turned on after the termination of the storage (time $t_4$) and then the first storage transistor Ca is turned off, the signal charge stored in FD+CSa is distributed to the floating diffusion FD and the storage capacitance CSa according to their capacitance ratios. Of them, a signal distributed to the floating diffusion FD is read as N1. In this event, N1 also contains the threshold voltage variation of the amplifying transistor SF as a fixed pattern noise component. Then, the transfer transistor T is turned on to completely transfer the photosignal charge stored in the photodiode PD to the floating diffusion FD where it is superimposed on the signal N1, thereby reading a signal as S1+N1 (time $t_5$). Then, the first storage transistor Ca is also turned on (time $t_6$) to mix together the charge of FD and the charge stored in CSa, thereby reading a signal as S1+S2+N2. Then, the second storage transistor Cb is also turned on (time $t_7$) to mix together the charge of FD+CSa and the charge stored in CSb, thereby reading a signal as S1+S2+S3+N3.

Then, the reset transistor R is turned on to reset the floating diffusion FD, the first storage capacitance CSa, and the second storage capacitance CSb (time $t_8$). By repeating the foregoing operations, the solid-state imaging element of this embodiment operates.

Given that the capacitance of FD is $C_{FD}$, the capacitance of the first storage capacitance CSa is $C_{CSa}$, and the capacitance of the second storage capacitance CSb is $C_{CSb}$, the widening factor of the dynamic range is expressed as $(C_{FD}+C_{CSa}+C_{CSb})/C_{FD}$ in a simplified manner. Actually, the influence of clock feedthrough of the reset transistor R becomes smaller in the order of resetting FD, FD+CSa, and FD+CSa+CSb so that the saturation voltage of the supersaturation side signal S1+S2 becomes higher than that of the before-saturation side signal S1 and, further, the saturation voltage of the supersaturation side signal S1+S2+S3 becomes even higher, and therefore, the dynamic range is widened by a factor equal to or greater than the above factor. In order to effectively widen the dynamic range without increasing the pixel size while maintaining a high photodiode fill factor, it is required to form a large storage capacitance with excellent area efficiency.

Synthesis of a wide dynamic range signal is realized by selection among the noise-removed before-saturation side signal S1, the noise-removed first supersaturation side signal (S1+S2), and the noise-removed second supersaturation side signal (S1+S2+S3). FIG. 7 is a schematic photoelectric conversion characteristic diagram showing the state of signal selection among S1, S1+S2, and S1+S2+S3. The selection among S1, S1+S2, and S1+S2+S3 is realized by a comparison between a preset switching reference voltage for S1 and (S1+S2) and a signal output voltage of S1 and a comparison between a preset switching reference voltage for (S1+S2) and (S1+S2+S3) and a signal output voltage of (S1+S2) to thereby select one of S1, S1+S2, and S1+S2+S3.

Herein, the switching reference voltage for S1 and (S1+S2) and the switching reference voltage for (S1+S2) and (S1+S2+S3) may be the same voltage. In FIG. 7, the switching reference voltage for S1 and (S1+S2) and the switching reference voltage for (S1+S2) and (S1+S2+S3) are shown to be the same. The switching reference voltage is set lower than the S1 saturation voltage and the S1+S2 saturation voltage so as not to be affected by saturation voltage variations of S1 and S1+S2 and, further, is set to a voltage adapted to maintain high the S/N ratio, at each switching point, between the supersaturation side signal S1+S2 (point A in FIG. 7) or S1+S2+S3 (point B in FIG. 7) and a noise signal (point C in FIG. 7) remaining after the noise removal. In the case where an image obtained by the solid-state imaging device is used for a purpose like appreciation by human eyes, the S/N ratio is preferably set to 40 dB or more, more preferably 43 dB or more, and further preferably 46 dB or more in order to prevent observation of variation in brightness.

Herein, by multiplying the gain of the first supersaturation side signal S1+S2 by a ratio of $(C_{FD}+C_{CSa})/C_{FD}$, it can be matched with the gain of the before-saturation side signal S1, while, by multiplying the gain of the second supersaturation side signal S1+S2+S3 by a ratio of $(C_{FD}+C_{CSa}+C_{CSb})/C_{FD}$, it can be matched with the gain of the before-saturation side signal S1. In this manner, it is possible to obtain a video signal with a widened dynamic range synthesized by selection of signals that are linear from low illumination to high illumination.

As also clear from the foregoing operations, in this solid-state imaging device, since the signal charges on the before-saturation side and the first supersaturation side are mixed together to obtain the first supersaturation side signal S1+S2, the signal charge close to the saturation of the before-saturation side optical signal S1 at the lowest is present in S1+S2 and, therefore, the tolerance to noise components such as reset noise and dark current on the first supersaturation side increases. Similarly, the signal charge close to the saturation of the first supersaturation side signal S1+S2 at the lowest is present in the second supersaturation side signal S1+S2+S3 and, therefore, the tolerance to noise components such as reset noise and dark current on the second supersaturation side increases. Using the effect that the noise tolerance for the first supersaturation side signal S1+S2 and the second supersaturation side signal S1+S2+S3 increases, even by employing next-field signals N3' and N2' shown in FIG. 5 to derive a difference between S1+S2+S3+N3 and N3'((S1+S2+S3+N3)−N3') and a difference between S1+S2+N2 and N2' ((S1+S2+N2)−N2') to thereby remove the fixed pattern noise component, it is possible to ensure sufficient S/N ratios even near the selection switching points between the before-saturation side and supersaturation side signals. Therefore, the frame memory is not necessarily required.

As described above, in the low illumination imaging where the photodiode PD is not saturated, it is possible to maintain the high sensitivity and the high S/N ratio using the before-saturation charge signal (S1) obtained by canceling the noise and, further, in the high illumination imaging where the photodiode PD is saturated, the photocharges overflowing from the photodiode are stored into the first and second storage capacitances so as to be taken in and the high S/N ratio is maintained using the signals (S1+S2) and (S1+S2+S3) obtained by canceling the noise in the same manner as the above, thereby realizing enlargement in dynamic range sufficiently wide on the high illumination side.

The solid-state imaging device of this embodiment achieves the increase in dynamic range by increasing the sensitivity on the high illumination side without decreasing the sensitivity on the low illumination side as described above and, further, does not raise the supply voltage over the normally used range, thus being adaptable to miniaturization of image sensors in the future. The addition of elements is minimized and thus an increase in pixel size is not caused.

Further, since the storage time is not divided for the high illumination side and the low illumination side as opposed to the conventional image sensor that realizes the increase in dynamic range, i.e. the storage is performed in the same storage time period without bridging frames, the quality is not degraded even in animation imaging.

Further, with respect also to the leakage current of the floating diffusion FD, in the image sensor of this embodiment, the minimum signal of $C_{FD}+C_{CSa}$ is the supersaturation charge plus the saturation charge from the photodiode PD and the minimum signal of $C_{FD}+C_{CSa}+C_{CSb}$ is the supersaturation charge plus the saturation charge from the photodiode PD plus the saturation charge of the floating diffusion FD and the first storage capacitance CSa, and thus, the charge amount larger than the FD leakage charge is handled and therefore there is an advantage of not being susceptible to the influence of FD leakage.

In the foregoing embodiment, the threshold voltage of the second storage transistor Cb is set lower than that of the transfer transistor T. However, it may be configured that the threshold voltage of the second storage transistor Cb is set equivalent to that of the transfer transistor T and the gate potential of the second storage transistor Cb is set positive in the storage period so that when the floating diffusion FD and the first storage capacitance CSa are saturated, an excess charge is efficiently transferred to the second storage capacitance CSb without returning to the side of the photodiode PD.

In the foregoing embodiment, two storage capacitances are used. However, the structure and operation can be similarly achieved even by using three or more storage capacitances. Even when the three or more storage capacitances are used, a switching reference voltage is set lower than saturation voltages so as not to be affected by saturation voltage variations and, further, is set to a voltage adapted to maintain high the S/N ratio between a signal and noise at each switching point. Using the three or more storage capacitances, it is possible to realize a further increase in dynamic range sufficiently wide further on the high illumination side while maintaining the high S/N ratio. The plurality of storage capacitances may all have the same capacitance value or may have different values. Preferably, the storage capacitance located at a position more distant from the floating diffusion FD has a larger capacitance value.

Second Embodiment

This embodiment is an embodiment based on another operating method of the solid-state imaging device according to the first embodiment. The structure of a solid-state imaging device of this embodiment is the same as that of the solid-state imaging device of the first embodiment described with reference to FIGS. 1 to 4. However, the threshold voltage of the first storage transistor Ca and the threshold voltage of the second storage transistor Cb are set lower than that of the transfer transistor T.

FIG. 8 is a main drive timing chart of the solid-state imaging device of this embodiment and FIG. 9 is a schematic potential diagram of a portion of the pixel from the photodiode, through the floating diffusion FD and the first storage capacitance, to the second storage capacitance.

At first, before exposure and storage, the first storage transistor Ca and the second storage transistor Cb are set to on, while the transfer transistor T and the reset transistor R are set to off. Then, the reset transistor R and the transfer transistor T are turned on to reset the floating diffusion FD, the first storage capacitance CSa, and the second storage capacitance CSb (time $t_0'$). In this event, the photodiode PD is completely depleted.

Then, reset noise of FD+CSa+CSb introduced immediately after turning off the reset transistor R is read as N3 (time $t_1'$). In this event, the noise signal N3 contains threshold voltage variation of the amplifying transistor SF as a fixed pattern noise component. Then, when the second storage transistor Cb is turned off, the signal charge stored in FD+CSa+CSb is distributed to FD+CSa and CSb according to their capacitance ratios. Of them, a signal distributed to FD+CSa is read as N2 (time $t_2'$). In this event, N2 also contains the threshold voltage variation of the amplifying transistor SF as a fixed pattern noise component.

Then, when the first storage transistor Ca is turned off, the signal charge stored in FD+CSa is distributed to FD and CSa according to their capacitance ratios. Of them, a signal distributed to FD is read as N1 (time $t_3'$). In this event, N1 also contains the threshold voltage variation of the amplifying transistor SF as a fixed pattern noise component. In a storage period (time $t_4'$), in the state where the first storage transistor Ca, the second storage transistor Cb, the reset transistor R, and the selection transistor X are off, photocharges before saturation of the photodiode PD are stored in the photodiode PD, while excess photocharges upon exceeding the saturation are stored in the floating diffusion FD so as to be superimposed on N1 through the transfer transistor T. An excess charge upon exceeding saturation of the photodiode PD and the floating diffusion FD due to irradiation of stronger light is stored in the first storage capacitance CSa so as to be superimposed on N2 through the first storage transistor Ca. Further, excess photocharges upon exceeding saturation of the photodiode PD, the floating diffusion FD, and the first storage capacitance CSa due to irradiation of stronger light are also stored in the second storage capacitance CSb through the second storage transistor Cb. Since the threshold voltage of the first storage transistor Ca and the threshold voltage of the second storage transistor Cb are set lower than that of the transfer transistor T, when the floating diffusion FD is saturated, the excess charge does not return to the PD side, but is efficiently transferred to the first storage capacitance CSa and, when the floating diffusion FD and the first storage capacitance CSa are saturated, the excess charge does not return to the side of the photodiode PD, but is efficiently transferred to the second storage capacitance CSb. By this operation, the charge overflowing from the photodiode PD in the supersaturated state is effectively used without discarding it. In this manner, the storage operation is performed per pixel by receiving the light with the same photodiode PD and in the same period both before the saturation and after the supersaturation.

After the termination of the storage, the selection transistor X and the transfer transistor T are turned on to completely transfer the photosignal charge stored in the photodiode PD to the floating diffusion FD where it is superimposed on the signal N1, thereby reading a signal as S1+N1 (time $t_5'$). Then, the first storage transistor Ca is also turned on (time $t_6'$) to mix together the charge of FD and the charge stored in CSa, thereby reading a signal as S1+S2+N2. Then, the second storage transistor Cb is also turned on (time $t_7'$) to mix together the charge of FD+CSa and the charge stored in CSb, thereby reading a signal as S1+S2+S3+N3. Then, the reset transistor R is turned on to reset the floating diffusion FD, the first storage capacitance CSa, and the second storage capacitance CSb (time $t_8'$). By repeating the foregoing operations, the solid-state imaging element of this embodiment operates.

In the foregoing embodiment, the threshold voltage of the first storage transistor Ca and the threshold voltage of the second storage transistor Cb are set lower than that of the transfer transistor T. However, it may be configured that the threshold voltage of the first storage transistor Ca and the threshold voltage of the second storage transistor Cb are set equivalent to that of the transfer transistor T and the gate potential of the first storage transistor Ca and the gate potential of the second storage transistor Cb are set positive in the storage period so that when the floating diffusion FD and the first storage capacitance CSa are saturated, an excess charge is efficiently transferred to the second storage capacitance CSb without returning to the side of the photodiode PD.

Also in this embodiment, there is obtained an effect similar to that shown in the first embodiment and, therefore, it is possible to realize an increase in dynamic range sufficiently wide on the high illumination side while maintaining the high S/N ratio.

Third Embodiment

FIG. 10 shows an equivalent circuit diagram of one pixel of a solid-state imaging device according to this embodiment and FIG. 11 shows a schematic sectional view thereof. A schematic plan view is the same as FIG. 3 of the first embodiment.

Each pixel comprises a photodiode PD1 for receiving light and producing photocharges, a transfer transistor T2 provided adjacent to the photodiode PD1 for transferring photocharges, a floating diffusion FD3 provided so as to be coupled to the photodiode PD1 through the transfer transistor T2, a first storage capacitance CSa4 and a second storage capacitance CSb5 for storing, through the transfer transistor T2, photocharges overflowing from the photodiode PD1 upon exposure storage operation, a reset transistor R6 formed so as to be coupled to the floating diffusion FD3 for draining signal charges out of the floating diffusion FD3, the first storage capacitance CSa4, and the second storage capacitance CSb5, a first storage transistor Ca7 provided between the floating diffusion FD3 and the first storage capacitance CSa4, a second storage transistor Cb8 provided between the first storage capacitance CSa4 and the second storage capacitance CSb5, an amplifying transistor SF9 for reading, as a voltage, a signal charge of the floating diffusion FD3, a signal charge of the floating diffusion FD3 and the first storage capacitance CSa4, or a signal charge of the floating diffusion FD3, the first storage capacitance CSa4, and the second storage capacitance CSb5, and a selection transistor X10 provided so as to be coupled to the amplifying transistor for selecting the pixel or a pixel block.

In the solid-state imaging device according to this embodiment, the pixels each having the foregoing structure are integrated in a two-dimensional or one-dimensional array, wherein, in each pixel, drive lines $\phi_T 11$, $\phi_{Ca} 12$, $\phi_{Cb} 13$, and $\phi_R 14$ are respectively connected to gate electrodes of the transfer transistor T2, the first storage transistor Ca7, the second storage transistor Cb8, and the reset transistor R6, a pixel selection line $\phi_X 15$ driven by a row shift register is connected to a gate electrode of the selection transistor X10, and further, an output line OUT16 is connected to an output-side source of the selection transistor X10 so as to be output under the control of a column shift register.

FIG. 11 is the same as FIG. 2 of the first embodiment except that the reset transistor R6 is coupled to an n$^+$-type semiconductor region, which is to serve as the floating diffusion, instead of the first storage capacitance CSa4. Like in the first embodiment, the threshold voltage of the second storage transistor Cb is set lower than that of the transfer transistor T. Further, a block diagram of the solid-state imaging device of this embodiment is also the same as FIG. 4 of the first embodiment.

A description will be given of an operating method of the solid-state imaging device of this embodiment described with reference to FIGS. 10 and 11. FIG. 12 is a main drive timing chart of the solid-state imaging device of this embodiment and FIG. 13 is a schematic potential diagram of a portion of the pixel from the photodiode, through the floating diffusion FD and the first storage capacitance, to the second storage capacitance.

At first, before exposure and storage, the first storage transistor Ca and the second storage transistor Cb are set to on, while the transfer transistor T and the reset transistor R are set to off. Then, the reset transistor R and the transfer transistor T are turned on to reset the floating diffusion FD, the first storage capacitance CSa, and the second storage capacitance CSb (time $t_0''$). In this event, the photodiode PD is completely depleted. Then, reset noise of FD+CSa+CSb introduced immediately after turning off the reset transistor R is read as N3 (time $t_1''$). In this event, the noise signal N3 contains threshold voltage variation of the amplifying transistor SF as a fixed pattern noise component.

Then, when the second storage transistor Cb is turned off, the signal charge stored in FD+CSa+CSb is distributed to FD+CSa and CSb according to their capacitance ratios. Of them, a signal distributed to FD+CSa is read as N2 (time $t_2''$). In this event, N2 also contains the threshold voltage variation of the amplifying transistor SF as a fixed pattern noise component. In a storage period (time $t_3''$), in the state where the first storage transistor Ca is on and the second storage transistor Cb, the reset transistor R, and the selection transistor X are off, photocharges before saturation of the photodiode PD are stored in the photodiode PD, while excess photocharges upon exceeding the saturation are stored in the floating diffusion FD and the first storage capacitance CSa so as to be superimposed on N2 through the transfer transistor T and the first storage transistor Ca. Further, excess photocharges upon exceeding saturation of the photodiode PD and the first storage capacitance CSa due to irradiation of stronger light are also stored in the second storage capacitance CSb through the second storage transistor Cb. Since the threshold voltage of the second storage transistor Cb is set lower than that of the transfer transistor T, when the floating diffusion FD and the first storage capacitance CSa are saturated, the excess charge does not return to the side of the photodiode PD, but is efficiently transferred to the second storage capacitance CSb. By this operation, the charge overflowing from the photodiode PD in the supersaturated state is effectively used without discarding it. In this manner, the storage operation is performed per pixel by receiving the light with the same photodiode PD and in the same period both before the saturation and after the supersaturation.

The selection transistor X is turned on after the termination of the storage (time $t_4''$), then the reset transistor R is turned on (time $t_5''$) to reset FD, then the reset transistor R is turned off, and then a signal present in FD is read as N1 (time $t_6''$). In this event, N1 also contains the threshold voltage variation of the amplifying transistor SF as a fixed pattern noise component. Then, the transfer transistor T is turned on to completely transfer the photosignal charge stored in the photodiode PD to the floating diffusion FD where it is superimposed on the signal N1 (time $t_7''$), thereby reading a signal as S1+N1.

Then, the first storage transistor Ca is also turned on (time $t_8''$) to mix together the charge of FD and the charge stored in CSa, thereby reading a signal as S1+S2+N2. Then, the second storage transistor Cb is also turned on (time $t_9''$) to mix together the charge of FD+CSa and the charge stored in CSb, thereby reading a signal as S1+S2+S3+N3. Then, the reset transistor R is turned on to reset the floating diffusion FD, the first storage capacitance CSa, and the second storage capacitance CSb (time $t_{10}''$). By repeating the foregoing operations, the solid-state imaging element of this embodiment operates.

The increase factor of the dynamic range, the wide dynamic range signal synthesis method, and so on are the same as those in the first embodiment.

Also in this embodiment, there is obtained an effect similar to that shown in the first embodiment and, therefore, it is possible to realize an increase in dynamic range sufficiently wide on the high illumination side while maintaining the high S/N ratio.

Fourth Embodiment

FIG. 14 shows an equivalent circuit diagram of one pixel of a solid-state imaging device according to this embodiment, FIGS. 15-1 and 15-2 show schematic sectional views thereof, and FIG. 16 shows a schematic plan view thereof.

Each pixel comprises a photodiode PD1 for receiving light and producing photocharges, a transfer transistor T2 provided adjacent to the photodiode PD1 for transferring photocharges, a floating diffusion FD3 provided so as to be coupled to the photodiode PD1 through the transfer transistor T2, an overflow gate LO17 provided between the photodiode PD1 and a first storage capacitance CSa4, the first storage capacitance CSa4 and a second storage capacitance CSb5 for storing, through the overflow gate LO17, photocharges overflowing from the photodiode PD1 upon exposure storage operation, a reset transistor R6 formed so as to be coupled to the floating diffusion FD3 for draining signal charges out of the floating diffusion FD3, the first storage capacitance CSa4, and the second storage capacitance CSb5, a first storage transistor Ca7 provided between the floating diffusion FD3 and the first storage capacitance CSa4, a second storage transistor Cb8 provided between the first storage capacitance CSa4 and the second storage capacitance CSb5, an amplifying transistor SF9 for reading, as a voltage, a signal charge of the floating diffusion FD3, a signal charge of the floating diffusion FD3 and the first storage capacitance CSa4, or a signal charge of the floating diffusion FD3, the first storage capacitance CSa4, and the second storage capacitance CSb5, and a selection transistor X10 provided so as to be coupled to the amplifying transistor for selecting the pixel or a pixel block.

In FIGS. 15-1 and 15-2, in a region related to an n-type semiconductor region 22 and an n$^+$-type semiconductor region 25, a p$^+$-type semiconductor region 18 is formed at an upper surface of a p-type well 21, so that the junction transistor type overflow gate LO is formed having the n-type semiconductor region 22 and the n$^+$-type semiconductor region 25 as its source and drain and having the p$^+$-type semiconductor region 18 as its gate. The other structure is the same as that of the foregoing third embodiment. The p$^+$-type semiconductor region 18 is electrically connected to a p$^+$-type semiconductor region 23 and the p-type well region 21.

In the solid-state imaging device according to this embodiment, the pixels each having the foregoing structure are integrated in a two-dimensional or one-dimensional array, wherein, in each pixel, drive lines $\phi_T 11$, $\phi_{Ca} 12$, $\phi_{Cb} 13$, and $\phi_R 14$ are respectively connected to gate electrodes of the transfer transistor T2, the first storage transistor Ca7, the second storage transistor Cb8, and the reset transistor R6, a pixel selection line $\phi_X 15$ driven by a row shift register is connected to a gate electrode of the selection transistor X10, and further, an output line OUT16 is connected to an output-side source of the selection transistor X10 so as to be output under the control of a column shift register.

In this embodiment, the threshold voltage of the second storage transistor Cb is set lower than that of the transfer transistor T like in the first embodiment and, simultaneously, the threshold voltage of the overflow gate LO is set lower than that of the transfer transistor T. Further, a block diagram of the solid-state imaging device of this embodiment is also the same as FIG. 4 of the first embodiment.

An operating method of the solid-state imaging device of this embodiment described with reference to FIGS. 14 to 16 is the same as FIG. 12 of the third embodiment. However, in a storage period (time $t_3$"), in the state where the first storage transistor Ca is off and the second storage transistor Cb, the reset transistor R, and the selection transistor X are off, photocharges before saturation of the photodiode PD are stored in the photodiode PD, while excess photocharges upon exceeding the saturation are stored in the first storage capacitance CSa through the overflow gate LO. Further, excess photocharges upon exceeding saturation of the photodiode PD and the first storage capacitance CSa due to irradiation of stronger light are also stored in the second storage capacitance CSb through the second storage transistor Cb. Since the threshold voltage of the overflow gate LO and the threshold voltage of the second storage transistor Cb are set lower than that of the transfer transistor T, when the first storage capacitance CSa is saturated, the excess charge does not return to the side of the photodiode PD, but is efficiently transferred to the second storage capacitance CSb. By this operation, the charge overflowing from the photodiode PD in the supersaturated state is effectively used without discarding it. In this manner, the storage operation is performed per pixel by receiving the light with the same photodiode PD and in the same period both before the saturation and after the supersaturation. The increase factor of the dynamic range, the wide dynamic range signal synthesis method, and so on are the same as those in the first embodiment.

Also in this embodiment, there is obtained an effect similar to that shown in the first embodiment and, therefore, it is possible to realize an increase in dynamic range sufficiently wide on the high illumination side while maintaining the high S/N ratio.

Fifth Embodiment

This embodiment is an embodiment based on another block diagram and operating method of each of the solid-state imaging devices according to the first to fourth embodiments. The structure of each pixel of a solid-state imaging device of this embodiment is the same as that of each of the solid-state imaging devices described in the first to fourth embodiments.

FIG. 17 shows a block diagram of the solid-state imaging device of this embodiment. A row shift register 34, a column shift register 35, vertical signal lines 38 and 38', a horizontal signal line 39, and an output circuit 37 are provided at the peripheral portion of a two-dimensionally arranged pixel array (30, 31, 32, 33). Herein, the pixel array of 2 pixels×2 pixels is shown for simplification, but the number of pixels is not limited thereto.

Signals sequentially read from each pixel are a noise signal N1, an optical signal before saturation charge-voltage converted in FD plus the noise signal S1+N1, a noise signal N2, a summed optical signal before and after the saturation charge-voltage converted in FD+CSa plus the noise signal S1+S2+N2, a noise signal N3, and a summed optical signal before and after the saturation charge-voltage converted in FD+CSa+CSb plus the noise signal S1+S2+S3+N3. These output signals are sequentially selected and read from the pixels through the vertical signal lines 38 and 38', the horizontal signal line 39, and the output circuit 39 by the row shift register 34 and the column shift register 35. The operation of noise removal (S1+N1)−N1, (S1+S2+N2)−N2, and (S1+S2+S3+N3)−N3 is performed using a subtraction circuit, thereby removing both random noise component and fixed pattern noise component. As will be described later, for adaptation to the case where one or more of the noise signals N1, N2 and N3 are read immediately after the start of storage, the noise signals are once stored in a frame memory and then the noise removal is carried out using the subtraction circuit. In this manner, the noise-removed before-saturation side signal S1 and supersaturation side signals S1+S2 and S1+S2+S3 are obtained. The subtraction circuit and the frame memory may be either formed on an image sensor chip or formed as a separate chip. In the solid-state imaging element of this embodiment, the read circuit system is simplified.

EXAMPLE 1

As a solid-state imaging device of this invention, there was prepared a solid-state imaging element having a pixel size of 20 μm square, a floating diffusion capacitance $C_{FD}$=3.4 fF, a first storage capacitance CSa=73 fF, and a second storage capacitance CSb=3700 fF, and its photoelectric conversion characteristics and dynamic range characteristics were measured. Each storage capacitance was formed by parallel capacitances of a MOS capacitance and a polysilicon-polysilicon capacitance.

FIG. 18 shows the photoelectric conversion characteristics of this Example. Saturation signal voltages of signals S1, S1+S2, and S1+S2+S3 were 500 mV, 1000 mV, and 1200 mV, respectively. Residual noise voltages remaining in S1, S1+S2, and S1+S2+S3 after noise removal were all equal to 0.09 mV.

The switching voltage from S1 to S1+S2 and the switching voltage from S1+S2 to S1+S2+S3 were set lower than the respective saturation voltages and set to 400 mV and 900 mV, respectively.

The S/N ratios of the signal S1+S2 and the signal S1+S2+S3 to the residual noise at the respective switching points were each obtained to be 46 dB and thus the solid-state imaging element having high-quality performance was realized.

Further, the dynamic ranges of S1, S1+S2, and S1+S2+S3 achieved 75 dB, 108 dB, and 143 dB, respectively.

In this Example, there was realized an increase in dynamic range sufficiently wide on the high illumination side while maintaining the high S/N ratio.

EXAMPLE 2

As a solid-state imaging device of this invention, there was prepared, by applying trench-type storage capacitance elements, a solid-state imaging element having a pixel size of 10 μm square, a floating diffusion capacitance $C_{FD}$=3.4 fF, a first storage capacitance CSa=148 fF, and a second storage capacitance CSb=15 pF, and its photoelectric conversion characteristics and dynamic range characteristics were measured.

Saturation signal voltages of signals S1, S1+S2, and S1+S2+S3 were 500 mV, 1000 mV, and 1200 mV, respectively. Residual noise voltages remaining in S1, S1+S2, and S1+S2+S3 after noise removal were all equal to 0.09 mV. The switching voltage from S1 to S1+S2 and the switching voltage from S1+S2 to S1+S2+S3 were set lower than the respective saturation voltages and set to 400 mV and 900 mV, respectively.

The S/N ratios of the signal S1+S2 and the signal S1+S2+S3 to the residual noise at the respective switching points were each obtained to be 40 dB and thus the solid-state imaging element having high-quality performance was realized. Further, the dynamic ranges of S1, S1+S2, and S1+S2+S3 achieved 75 dB, 114 dB, and 175 dB, respectively.

In this Example, there was realized an increase in dynamic range sufficiently wide on the high illumination side while maintaining the high S/N ratio.

This invention is not limited to the foregoing description. For example, the solid-state imaging devices are described in the embodiments, but not limited thereto. With respect also to a line sensor in which the pixels of each of the solid-state imaging devices are linearly arranged or an optical sensor obtained by forming the pixel of each of the solid-state imaging devices alone as it is, it is possible to achieve an increase in dynamic range, a high sensitivity, and a high S/N ratio that cannot be obtained conventionally.

Further, the shape and so on of the storage capacitance are not particularly limited. Various methods can be employed such as a MOS capacitance, a polysilicon-polysilicon capacitance, and a trench capacitance or a stacked capacitance for a DRAM memory storage capacitance that has been developed so far for increasing the capacitance. As a solid-state imaging device, there can be cited a CCD image sensor in addition to a CMOS image sensor. Further, various changes can be made in a range without departing from the gist of this invention. For example, in the embodiments, the description has been given of the case where the signal charge is stored into the first and second storage capacitances, but this invention is also applicable to a structure where a signal charge is stored into multistage storage capacitances.

INDUSTRIAL APPLICABILITY

A solid-state imaging device of this invention is applicable to an image sensor, desired to have a wide dynamic range, of a digital camera, a portable telephone with camera, a monitoring camera, an on-vehicle camera, or the like.

A solid-state imaging device operating method of this invention is applicable to an operating method of an image sensor desired to have a wide dynamic range.

The invention claimed is:

1. A solid-state imaging device operating method of a solid-state imaging device,
the solid-state imaging device having a plurality of pixels integrated in a one-dimensional or two-dimensional array;
each of said plurality of pixels comprising:
at least a photodiode for receiving light and producing photocharges, a transfer transistor coupled to said photodiode for transferring said photocharges,
a floating region to which said photocharges are transferred through said transfer transistor,
a first storage transistor coupled to said transfer transistor,
a first storage capacitance element for storing photocharges overflowing from said photodiode through said transfer transistor and said first storage transistor in storage operation,
a second storage transistor for transferring photocharges overflowing from said first storage capacitance element, and
a second storage capacitance element for storing the photocharges overflowing from said first storage capacitance element through said second storage transistor;
said operating method comprising:
a step of, before charge storage, turning on said first and second storage transistors to drain photocharges out of said floating region and said first and second storage capacitance elements, a step of storing before-saturation charges of photocharges produced by said photodiode, in said photodiode and storing supersaturation charges overflowing from said photodiode, into said floating region and said first storage capacitance element, a step of turning off said first storage transistor to drain the photocharges out of said floating region, a step of turning on said transfer transistor to transfer said before-saturation charges to said floating region, thereby reading a before-saturation signal indicative of a voltage signal of said before-saturation charges, a step of turning on said first storage transistor, thereby reading a first supersaturation signal indicative of a voltage signal of the sum of said before-saturation charges and said supersaturation charges having overflowed from said photodiode, and a step of tuning on said second storage transistor, thereby reading a second supersaturation signal indicative of a voltage signal of the sum of said before-saturation charges, said supersaturation charges having overflowed from said photodiode, and supersaturation charges having overflowed from said first storage capacitance element.

2. A solid-state imaging device operating method according to claim 1, further comprising an output signal selection step of selecting at least one of said before-saturation signal, said first supersaturation signal, and said second supersaturation signal by comparison with a predetermined reference voltage.

3. A solid-state device operating method according to claim 2, wherein said output signal selection step selects said first supersaturation signal as an output signal when said before-saturation signal is greater than a first reference voltage and selects said second supersaturation signal as an output signal when said first supersaturation signal is greater than a second reference voltage.

4. A solid-state imaging device operating method of a solid-state imaging device, the solid-state imaging device having a plurality of pixels integrated in a one-dimensional or two-dimensional array, each of said plurality of pixels comprising:

at least a photodiode for receiving light and producing photocharges, a transfer transistor coupled to said photodiode for transferring said photocharges, a floating region to which said photocharges are transferred through said transfer transistor, an overflow gate coupled to said photodiode, a first storage capacitance element for storing photocharges overflowing from said photodiode through said overflow gate in storage operation, a first storage transistor for transferring photocharges overflowing from said first storage capacitance element, a second storage capacitance element for storing the photocharges overflowing from said first storage capacitance element through said first storage transistor, and a second storage transistor connected between said floating region and said first storage capacitance element;

said operating method comprising:

a step of, before charge storage, turning on said first storage transistor and said second storage transistor to drain photocharges out of said floating region and said first and second storage capacitance elements, a step of storing before-saturation charges, of photocharges produced by said photodiode, in said photodiode and storing supersaturation charged overflowing from said photodiode into said first storage capacitance element through said overflow gate, a step of turning on said transfer transistor to transfer said before-saturation charges to said floating region, thereby reading a before-saturation signal indicative of a voltage signal of said before-saturation charges, a step of turning on said second storage transistor, thereby reading a first supersaturation signal indicative of a voltage signal of the sum of said before-saturation charges and said supersaturation charges having overflowed from said photodiode, and a step of turning on said first storage transistor, thereby reading a second supersaturation signal indicative of a voltage signal of the sum of said before-saturation charges, said supersaturation charges having overflowed from said photodiode, and supersaturation charges having overflowed from said first storage capacitance element.

5. A solid-state imaging device operating method according to claim 4, further comprising an output signal selection step of selecting at least one of said before-saturation signal, said first supersaturation signal, and said second supersaturation signal by comparison with a predetermined reference voltage.

6. A solid-state imaging device operating method according to claim 5, wherein said output signal selection stop selects said first supersaturation signal as an output signal when said before-saturation signal is greater than a first reference voltage and selects said second-supersaturation signal as an output signal when said first supersaturation signal is greater than a second reference voltage.

7. A solid-state imaging device operating method of a solid-state imaging device, the solid-state imaging device comprising: a photodiode which receives light and which produces and stores photocharges, a floating region, a transfer transistor which is connected between said photodiode and the floating region and which transfers the photocharges to the floating region, a first storage capacitance element, a second storage capacitance element, a first storage transistor which is connected between the floating region and the first storage capacitance element, and a second storage transistor which is connected between the first capacitance element and the second capacitance element; the operating method comprising: a step of storing, into the first storage capacitance element within a storage period of the photodiode, photocharges overflowing from the photodiode, a step of storing, into the second storage capacitance element within the storage period of the photodiode, photocharges which overflow from the photodiode and also overflow from the first storage capacitance element; a step of turning on the transfer transistor within a transfer period following the storage period of the photodiode, the transfer the photocharges stored in the photodiode to the floating region and to store the photocharges into the floating region; a step of turning on the first storage transistor within a period after the transfer period, to mix the photocharges which overflow from the photodiode and which are stored in the first storage capacitance element with the photocharges stored in the floating region; a step of turning on the second storage transistor within a period after the transfer period, to mix the photocharges which overflow from the photodiode and the first storage capacitance element and which are stored in the second storage capacitance element, together with the photocharges which overflow from the photodiode and which are stored in the first storage capacitance element, and the photocharges stored in the floating region; a step of, before charge storage, turning on the first storage transistor and the second storage transistor to drain photocharges out of the floating region and both of the first and the second storage capacitance elements, a step of a turning off the transfer transistor and turning on the first and second storage transistors to read a noise signal (N3) from the floating region and the first and the second storage capacitance elements: a step of turning off the transfer transistor and the second storage transistor and turning on the first storage transistor to read a noise signal (N2) from the floating region and the first storage capacitance element; a step of reading a noise signal (N1) from the floating region before or after storing photocharges produced by the photodiode; step of storing, in the photodiode, pre-saturation photocharges in the photocharges produces by the photodiode and storing, in the first storage capacitance element, supersaturation photocharges overflowing from the photodiode and storing, in the second storage capacitance element, the photocharges overflowing from the first storage capacitance element; a step of turning of the first storage transistor and turning on the transfer transistor, to transfer the pre-saturation photocharges to the floating region and to read, from the floating region, a first signal specified by a voltage signal indicative of the photocharges stored in the floating region; a step of turning on the first storage transistor to read a second signal specified by a voltage signal indicative of a sum of the photocharges stored in the floating region and the photocharges stored in the first storage capacitance element; a step of turning on both the first and the second storage transistors to read a third signal specified by a voltage signal indicative of a sum of the photocharges stored in the floating region, the first storage capacitance element, and the second storage capacitance element; and a step of removing noise from the first, the second, and the third signals by the use of the first noise signal (N1), the second noise signal (N2), and the third noise signal (N3), respectively.

* * * * *